(12) United States Patent
Ino

(10) Patent No.: US 11,646,599 B2
(45) Date of Patent: May 9, 2023

(54) POWER SUPPLY SYSTEM AND METHOD FOR CONTROLLING SAME

(71) Applicant: HONDA MOTOR CO., LTD., Tokyo (JP)

(72) Inventor: Mitsuyasu Ino, Wako (JP)

(73) Assignee: HONDA MOTOR CO., LTD., Tokyo (JP)

(*) Notice: Subject to any disclaimer, the term of this patent is extended or adjusted under 35 U.S.C. 154(b) by 0 days.

(21) Appl. No.: 17/778,029

(22) PCT Filed: Nov. 19, 2020

(86) PCT No.: PCT/JP2020/043159
§ 371 (c)(1),
(2) Date: May 19, 2022

(87) PCT Pub. No.: WO2021/100799
PCT Pub. Date: May 27, 2021

(65) Prior Publication Data
US 2022/0416562 A1    Dec. 29, 2022

(30) Foreign Application Priority Data
Nov. 20, 2019   (JP) .............................. JP2019-209519

(51) Int. Cl.
H02J 7/34    (2006.01)
G01R 19/10   (2006.01)
H02J 7/00    (2006.01)

(52) U.S. Cl.
CPC .............. *H02J 7/342* (2020.01); *G01R 19/10* (2013.01); *H02J 7/00714* (2020.01); *H02J 7/007182* (2020.01)

(58) Field of Classification Search
CPC .. H02J 7/342; H02J 7/00714; H02J 7/007182; G01R 19/10
(Continued)

(56) References Cited

U.S. PATENT DOCUMENTS 3,667,025 A * 5/1972 Campbell ............. H02J 7/0018
                                                      320/140
8,035,252 B2 * 10/2011 Ichikawa ............ H01M 10/637
                                                      307/46
(Continued)

FOREIGN PATENT DOCUMENTS

EP          2061128       5/2009
JP          2008-220084   9/2008
(Continued)

OTHER PUBLICATIONS

International Search Report and Written Opinion for International Application No. PCT/JP2020/043159 dated Dec. 22, 2020, 8 pages.
(Continued)

*Primary Examiner* — M Baye Diao
(74) *Attorney, Agent, or Firm* — Amin, Turocy & Watson, LLP

(57) ABSTRACT

In a power supply system and a method for controlling the same, at least one battery from among a plurality of batteries is designated as a charging-side battery, and the remaining batteries are designated as discharging-side batteries. Next, the difference in current between the current flowing from the discharging-side batteries and the current flowing into the charging-side battery is determined on the basis of currents measured by a plurality of current measuring instruments. Next, the transformation rate of a voltage transformer connected to the discharging-side batteries is determined on the basis of the determined difference in current.

6 Claims, 17 Drawing Sheets

(58) Field of Classification Search
USPC .......................................................... 320/128
See application file for complete search history.

(56) References Cited

U.S. PATENT DOCUMENTS

| | | | | |
|---|---|---|---|---|
| 9,209,639 | B2 * | 12/2015 | Nishikawa | ................ H02J 5/00 |
| 10,189,368 | B2 * | 1/2019 | Takizawa | ................ B60L 58/12 |
| 10,199,956 | B2 * | 2/2019 | Kitamoto | .......... H01M 8/04649 |
| 10,661,670 | B2 * | 5/2020 | Takizawa | ................ B60L 50/51 |
| 2012/0032505 | A1 | 2/2012 | Kusumi | |

FOREIGN PATENT DOCUMENTS

| | | |
|---|---|---|
| JP | 2016-025791 | 2/2016 |
| JP | 2016-063717 | 4/2016 |
| JP | 2019-193475 | 10/2019 |

OTHER PUBLICATIONS

Extended European Search Report for European Patent Application No. 20889216.6 dated Mar. 14, 2023.

\* cited by examiner

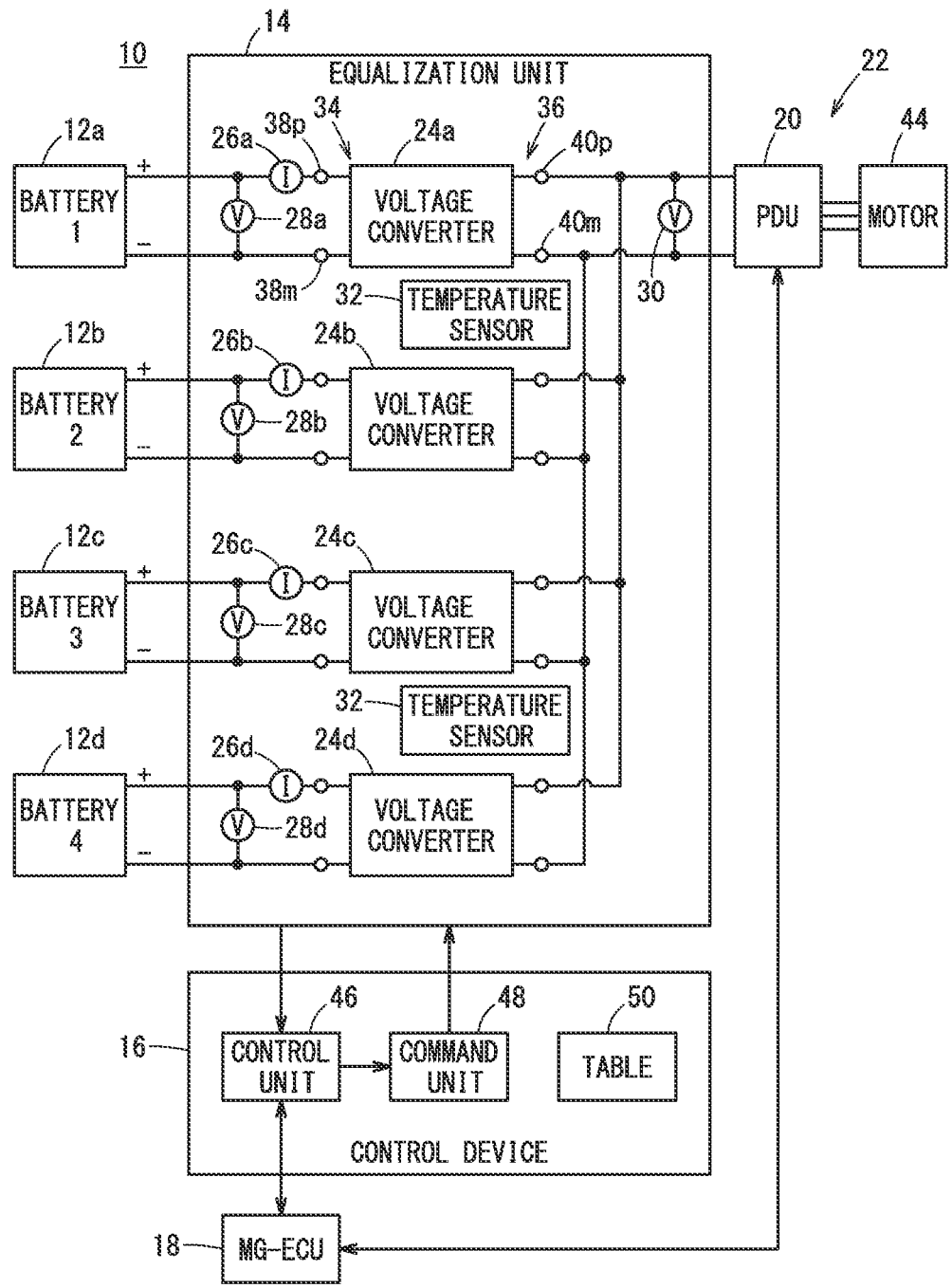

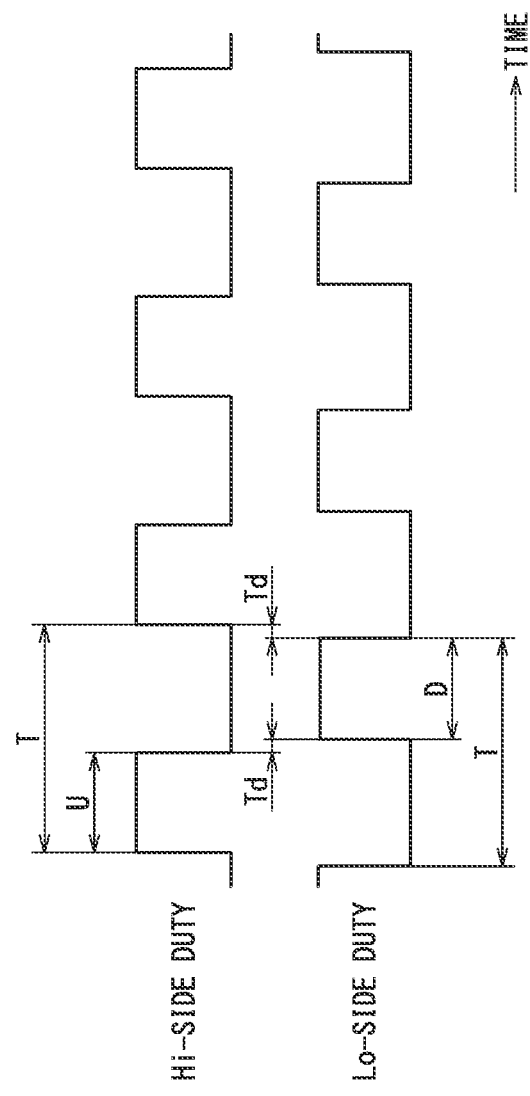

FIG. 6

| NUMBER OF BATTERIES TO BE DISCHARGED \ NUMBER N OF BATTERIES | N=4 | N=3 | N=2 |
|---|---|---|---|
| THREE | 3H1L: MPP1 1.5Id[A], MPP2 1Id[A], MPP3 1Id[A], MPP4 0.0[A] | | |
| TWO | 2H2L: MPP1 1.5Id[A], MPP2 1.5Id[A], MPP3 0.0[A], MPP4 0.0[A] | 2H1L: MPP1 1.125Id[A], MPP2 1.125Id[A], MPP3 0.0[A] | |
| ONE | 1H3L: MPP1 3.0Id[A], MPP2 0.0[A], MPP3 0.0[A], MPP4 0.0[A] | 1H2L: MPP1 3.0Id[A], MPP2 0.0[A], MPP3 0.0[A] | 1H1L: MPP1 1.5Id[A], MPP2 0.0[A] |
| ZERO | 0H4L: MPP1 0.0[A], MPP2 0.0[A], MPP3 0.0[A], MPP4 0.0[A] | 0H3L: MPP1 0.0[A], MPP2 0.0[A], MPP3 0.0[A] | 0H2L: MPP1 0.0[A], MPP2 0.0[A] |

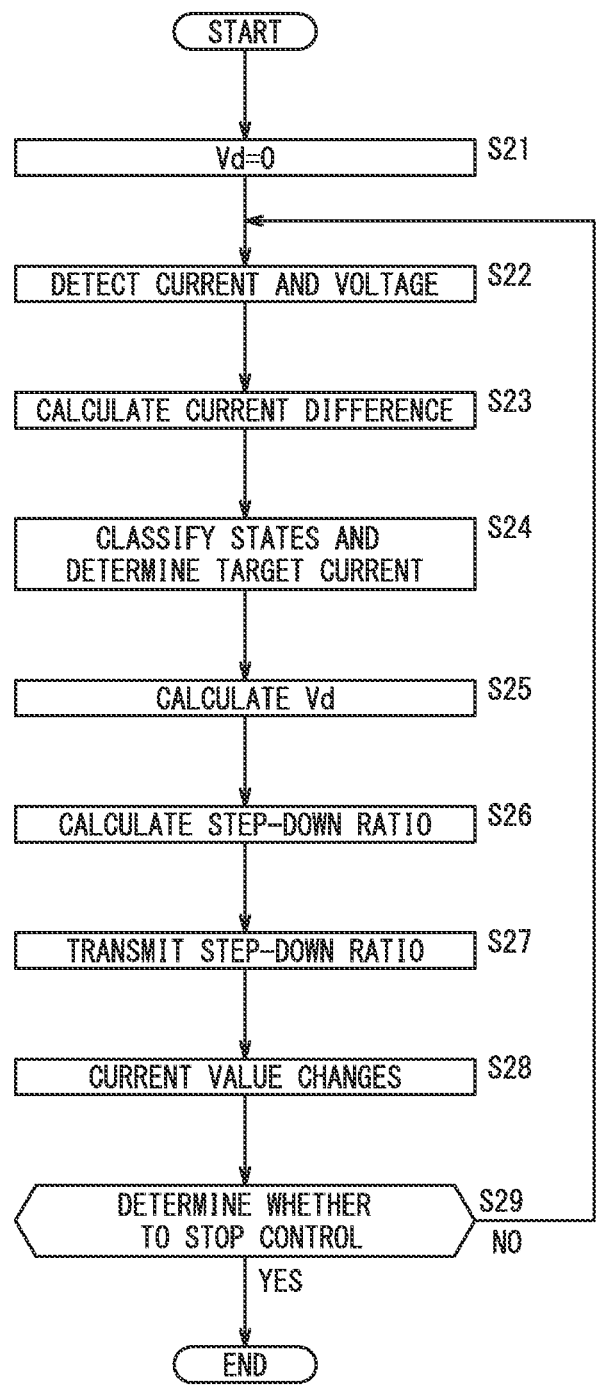

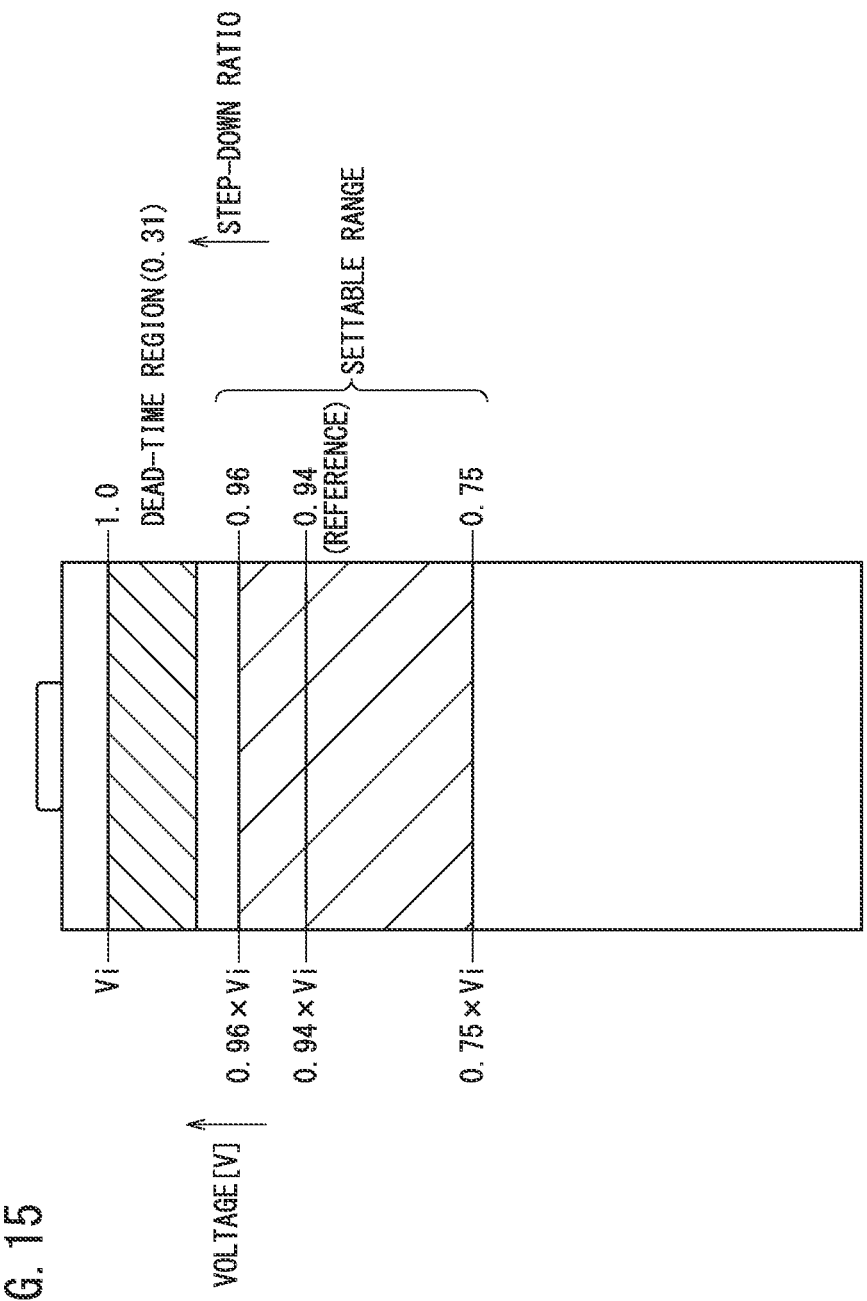

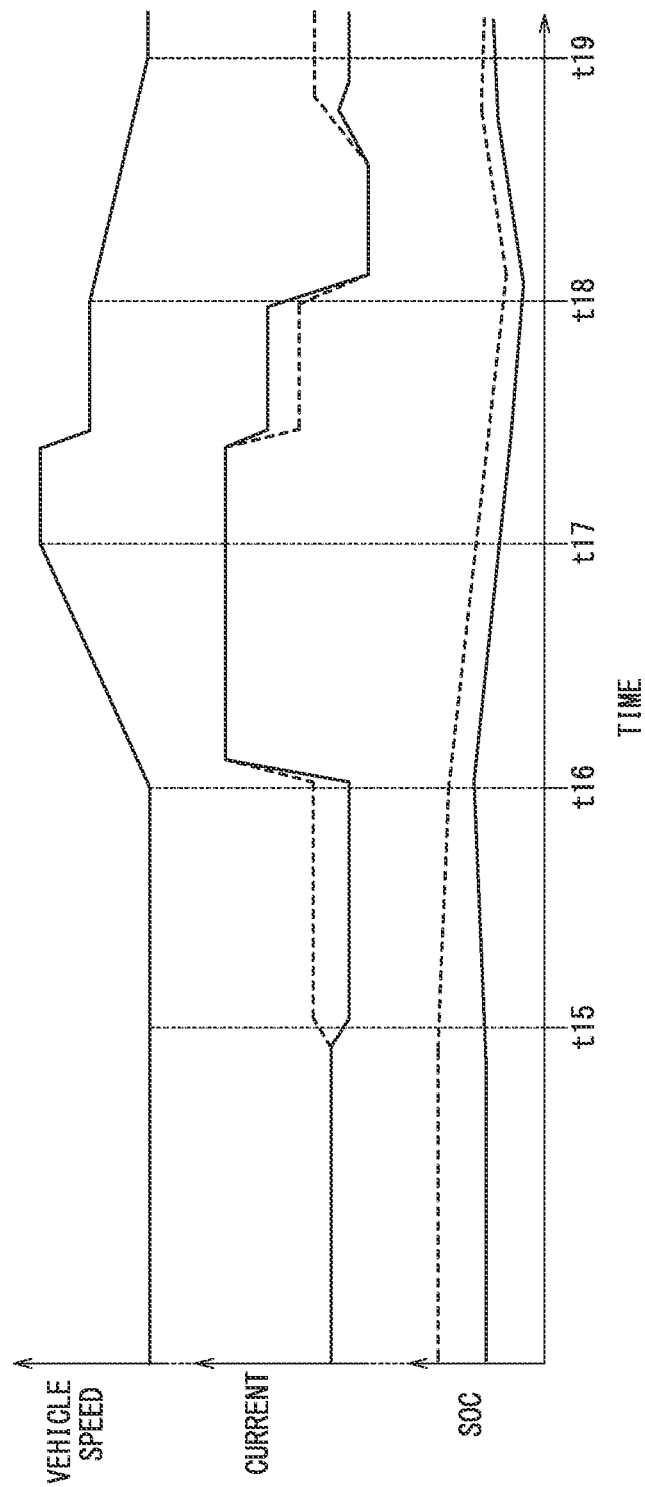

POWER SUPPLY SYSTEM AND METHOD FOR CONTROLLING SAME

TECHNICAL FIELD

The present invention relates to a power supply system in which a plurality of chargeable and dischargeable power storage units are connected in parallel to each other via voltage converters, and to a method for controlling the power supply system.

BACKGROUND ART

For example, JP 2016-025791 A discloses a power supply system in which a plurality of chargeable and dischargeable batteries (power storage units) are connected in parallel to each other via voltage converters.

SUMMARY OF THE INVENTION

When a plurality of power storage units having different voltages or SOCs are connected in parallel to each other, charging and discharging are performed such that currents flow in proportion to the voltage differences among the plurality of power storage units so as to make the voltages or SOCs equal among the power storage units. In this case, when a plurality of power storage units are simply connected, a small, negligible voltage difference will cause no problem even if the power storage units are directly connected in parallel.

However, when a plurality of power storage units having large voltage differences are connected in parallel, a large current flows due to the voltage differences. Moreover, in this state, even when the plurality of power storage units are connected in parallel to each other via the voltage converters, a large current flows at the moment when the switching element of the voltage converter is turned on, and a high voltage due to the inductance component of the wiring is generated at the moment when the switching element is turned off. The power storage units may deteriorate due to the generation of such a large current or high voltage.

The present invention has been made in consideration of such problems, and an object thereof is to provide a power supply system capable of equalizing voltages or SOCs of a plurality of power storage units connected in parallel to each other while avoiding deterioration of the power storage units, and a method for controlling the power supply system.

According to an aspect of the present invention, provided are a power supply system, and a method for controlling the power supply system, the power supply system comprising: a plurality of power storage units that are chargeable and dischargeable; a plurality of voltage converters having input sides connected to the plurality of power storage units, respectively, and output sides connected in parallel to each other, the voltage converters being configured to convert voltages of the plurality of power storage units connected to the input sides at arbitrary voltage conversion ratios, and output the converted voltages to the output sides; and a plurality of current measuring instruments connected to the input sides of the plurality of voltage converters, respectively, and configured to measure currents flowing from the plurality of power storage units to the input sides.

In this case, the power supply system further comprises: a power storage unit determination unit configured to determine at least one of the plurality of power storage units as a reference power storage unit to be charged and determine remaining ones of the plurality of power storage units as remaining power storage units to be discharged; a current difference determination unit configured to determine a current difference between the currents flowing from the remaining power storage units and the current flowing from the reference power storage unit, based on the currents measured by the plurality of current measuring instruments; and a voltage conversion ratio determination unit configured to determine the voltage conversion ratio of the voltage converters connected to the remaining power storage units, based on the determined current difference.

Further, the method for controlling the power supply system comprises: a step of determining, by a power storage unit determination unit, at least one of the plurality of power storage units as a reference power storage unit to be charged, and determining, by the power storage unit determination unit, remaining ones of the plurality of power storage units as remaining power storage units to be discharged; a step of determining, by a current difference determination unit, a current difference between the currents flowing from the remaining power storage units and the current flowing from the reference power storage unit, based on the currents measured by the plurality of current measuring instruments; and a step of determining, by a voltage conversion ratio determination unit, the voltage conversion ratio of the voltage converters connected to the remaining power storage units, based on the determined current difference.

According to the present invention, the current difference between each of the currents flowing from the remaining power storage units and the current flowing from the reference power storage unit is fed back, and the voltage conversion ratio of each of the voltage converters connected to the remaining power storage units is determined so that the current difference becomes small. Thus, when the plurality of power storage units are connected in parallel to each other via the voltage converters, the voltages or SOCs of the plurality of power storage units connected in parallel to each other can be equalized while avoiding deterioration of the power storage units.

BRIEF DESCRIPTION OF DRAWINGS

FIG. 1 is a configuration diagram of a power supply system according to the present embodiment;

FIG. 3 is a timing chart showing the step-up/step-down operation;

FIG. 6 is a diagram showing a list of classifications of charge/discharge states of batteries;

FIG. 8 is a flowchart illustrating a portion of the control method of FIG. 7;

FIG. 15 is an explanatory diagram showing a settable range of the step-down ratio;

FIG. 17 is a timing chart showing temporal changes of the vehicle speed of an electric vehicle, each current, and each SOC.

DESCRIPTION OF THE INVENTION

Figure 2A:
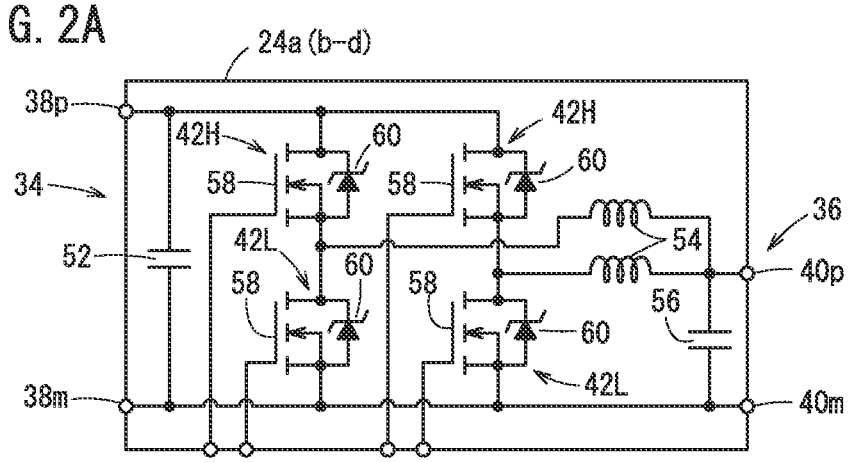
FIG. 2A is a circuit diagram of a step-down or step-up/step-down voltage converter.

Hereinafter, a preferred embodiment of a power supply system and a method for controlling the power supply system according to the present invention will be illustrated and described in an exemplary manner with reference to the accompanying drawings.

1. Schematic Configuration of Present Embodiment

As illustrated in FIG. 1, a power supply system 10 according to the present embodiment includes a plurality of batteries 12a to 12d (power storage units), an equalization unit 14, a control device 16, a motor generator ECU (MG-ECU) 18, and a power drive unit (PDU) 20. Note that FIG. 1 illustrates a case where four batteries 12a to 12d (hereinafter also referred to as the first to fourth batteries 12a to 12d) are arranged. In the power supply system 10, at least two batteries may be disposed. The power supply system 10 is applied to a power supply system of an electric vehicle 22 such as a two wheeled vehicle or a four wheeled vehicle, for example.

The plurality of batteries 12a to 12d are chargeable and dischargeable power storage units that can be attached to and detached from the power supply system 10. The plurality of batteries 12a to 12d are respectively housed in battery packs (not shown) including battery management systems (BMUs) for monitoring the batteries 12a to 12d, and can be attached to and detached from the power supply system 10 by attaching and detaching the battery packs to and from the power supply system 10. In the present embodiment, at least one of the plurality of batteries 12a to 12d may be attached to and detached from the power supply system 10. In addition, each battery pack, the equalization unit 14, the control device 16, the MG-ECU 18, and the PDU 20 can transmit and receive signals or information via a communication line or the like (not illustrated) constituting a Controller Area Network (CAN).

The equalization unit 14 includes a plurality of voltage converters 24a to 24d, a plurality of current measuring instruments 26a to 26d, a plurality of input-side voltage measuring instruments (voltage measuring instruments) 28a to 28d, an output-side voltage measuring instrument 30, and a plurality of temperature sensors 32.

The plurality of voltage converters 24a to 24d are, for example, DC-DC converters each having an input side 34 that is a primary side and an output side 36 that is a secondary side. The voltage converters 24a to 24d convert voltages (battery voltages V1 to V4) of the batteries 12a to 12d connected to the input sides 34, at an arbitrary voltage conversion ratio Tr (step-up ratio Tru or step-down ratio Trd (hereinafter also referred to as step-down ratio R)), and output the converted voltages (output voltage V0) to the output sides 36. FIG. 1 illustrates a case where four voltage converters 24a to 24d (hereinafter also referred to as the first to fourth voltage converters 24a to 24d) are disposed in the equalization unit 14, correspondingly to the first to fourth batteries 12a to 12d, respectively. In the following description, a case will be described in which the first to fourth voltage converters 24a to 24d step down the battery voltages V1 to V4 of the first to fourth batteries 12a to 12d at arbitrary step-down ratios R1 to R4, and output the stepped down battery voltages V1 to V4 to the output sides 36 as the output voltage V0.

The input side 34 of each of the first to fourth voltage converters 24a to 24d is connected to any one of the batteries 12a to 12d among the first to fourth batteries 12a to 12d. That is, the positive electrode terminals of the first to fourth batteries 12a to 12d are respectively connected to positive electrode terminals 38p on the input sides 34 of the first to fourth voltage converters 24a to 24d. The negative electrode terminals of the first to fourth batteries 12a to 12d are respectively connected to negative electrode terminals 38m on the input sides 34 of the first to fourth voltage converters 24a to 24d. The output sides 36 of the first to fourth voltage converters 24a to 24d are connected in parallel to each other and are thereby connected in parallel to the PDU 20. In this case, positive electrode terminals 40p on the output sides 36 of the first to fourth voltage converters 24a to 24d are connected to the positive electrode terminal of the PDU 20, and negative electrode terminals 40m on the output sides 36 of the first to fourth voltage converters 24a to 24d are connected to the negative electrode terminal of the PDU 20.

The plurality of input side voltage measuring instruments 28a to 28d (hereinafter also referred to as the first to fourth voltage measuring instruments 28a to 28d) are voltage sensors respectively connected between the positive electrode terminals and the negative electrode terminals of the first to fourth batteries 12a to 12d on the input sides 34 of the first to fourth voltage converters 24a to 24d. Further, the plurality of current measuring instruments 26a to 26d (hereinafter, also referred to as the first to fourth current measuring instruments 26a to 26d) are current sensors respectively connected between the positive electrode terminals of the first to fourth batteries 12a to 12d and the positive electrode terminals 38p of the first to fourth voltage converters 24a to 24d on the input sides 34 of the first to fourth voltage converters 24a to 24d. The output-side voltage measuring instrument 30 is a voltage sensor connected between the positive electrode terminal and the negative electrode terminal of the PDU 20 on the output sides 36 of the first to fourth voltage converters 24a to 24d.

The plurality of temperature sensors 32 respectively detect the temperature of switching elements 42H and 42L (see FIGS. 2A to 2C) that constitute each of the first to fourth voltage converters 24a to 24d. FIG. 1 shows a case where two temperature sensors 32 are provided.

The PDU 20 is configured to include a three phase bridge inverter. The first to fourth voltage converters 24a to 24d are connected in parallel to the input side of the PDU 20. A three phase AC motor 44, which is a load of the power supply system 10, is electrically connected to the output side of the PDU 20. During power running, DC power is supplied from the first to fourth batteries 12a to 12d to the PDU 20 via the first to fourth voltage converters 24a to 24d. The PDU 20 converts the DC power into three phase AC power and supplies the AC power to the motor 44. As a result, the motor 44 can be driven, whereby the electric vehicle 22 can travel. On the other hand, during regeneration, the PDU 20 converts the AC power generated by the motor 44 into DC power. Thus, the first to fourth batteries 12a to 12d can be charged with DC power via the first to fourth voltage converters 24a to 24d.

The MG-ECU 18 (power storage unit determination unit) is an ECU (electronic control unit) for controlling the PDU 20 and the motor 44, and can transmit and receive signals or information to and from the control device 16 and the PDU 20. That is, the MG-ECU 18 supplies control signals (signals indicating command values of torque) for operating the switching elements 42H and 42L constituting the PDU 20. On the other hand, the PDU 20 transmits the state or the like of the PDU 20. The motor 44 transmits the state or the like of the motor 44. The MG-ECU 18 calculates a required output of the motor 44 based on the information or the like transmitted from the PDU 20 and the motor 44, and transmits the calculated required output to the control device 16.

The control device 16 is an ECU for controlling the equalization unit 14, and includes a control unit 46 (power storage unit determination unit, current difference determination unit, voltage conversion ratio determination unit), a command unit 48, and a table 50. The control unit 46 acquires: the battery voltages V1 to V4 of the first to fourth batteries 12a to 12d measured by the first to fourth voltage measuring instruments 28a to 28d; first to fourth currents I1 to I4 measured by the first to fourth current measuring instruments 26a to 26d; the output voltage V0 (load voltage) measured by the output-side voltage measuring instrument 30; and the temperatures of the first to fourth voltage converters 24a to 24d measured by the plurality of temperature sensors 32. Further, the control unit 46 calculates (determines) the voltage conversion ratio Tr and the like, based on the required output from the MG-ECU 18 and the target value of the current (target current Itar) flowing through the input side 34. The target current Itar is stored in the table 50. The command unit 48 outputs, to the equalization unit 14, command signals (gate signals supplied to the switching elements 42H and 42L of the first to fourth voltage converters 24a to 24d) that are based on the voltage conversion ratio Tr determined by the control unit 46. The details of the processes of the control device 16 and the MG-ECU 18 will be described later.

2. Specific Examples of First to Fourth Voltage Converters 24a to 24d

Figure 2B:
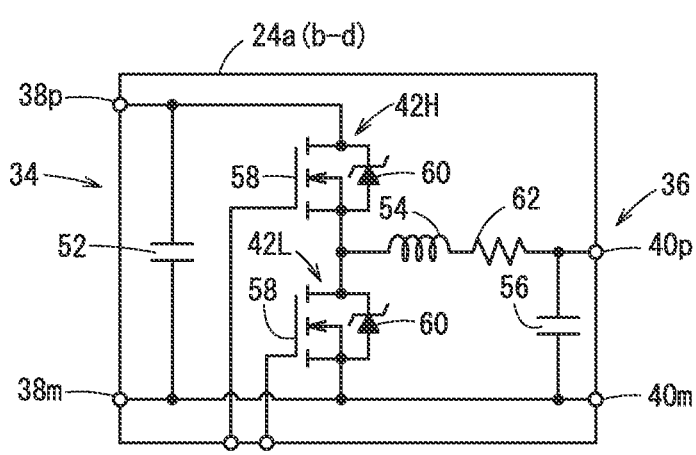
FIG. 2B is a circuit diagram of the step-down voltage converter.
Figure 2C:
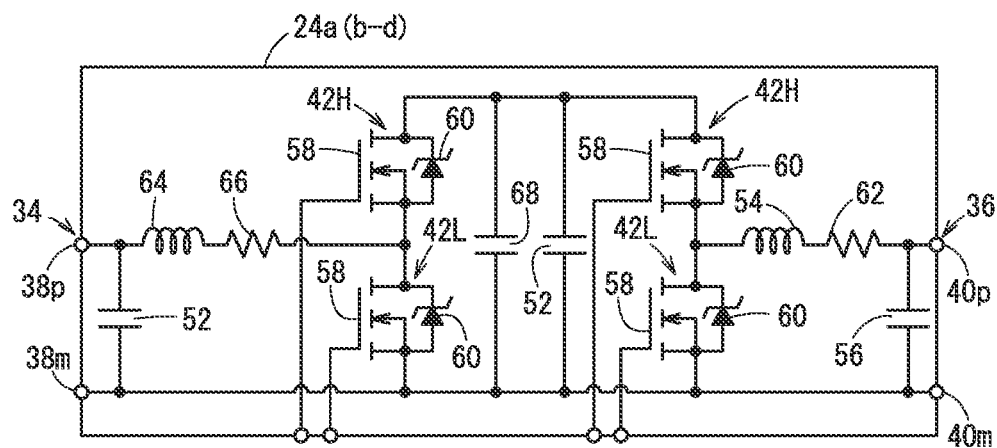
FIG. 2C is a circuit diagram of the step-up/step-down voltage converter.

FIGS. 2A to 2C are circuit diagrams showing specific examples of the first to fourth voltage converters 24a to 24d in FIG. 1. The first to fourth voltage converters 24a to 24d are, for example, step-down or step-up/step-down DC-DC converters (see FIG. 2A), step-down DC-DC converters (see FIG. 2B), or step-up/step-down DC-DC converters (see FIG. 2C). The configuration and operation of these DC-DC converters are well known. Therefore, here, a connection relationship of respective components in the circuit diagrams of FIGS. 2A to 2C will be briefly described.

In FIG. 2A, a capacitor 52 is connected between the positive electrode terminal 38p and the negative electrode terminal 38m on the input side 34. Two sets of circuits, each of which is formed of a set of two switching elements 42H and 42L connected in series and a coil 54, are connected in parallel to the capacitor 52. In each set, the switching element 42H is a high-side switching element connected to the positive electrode terminal 38p of the capacitor 52. The switching element 42L is a low-side switching element connected to the negative electrode terminal 38m of the capacitor 52 and the negative electrode terminal 40m on the output side 36. One end of the coil 54 is connected to a midpoint between the two switching elements 42H and 42L. The other end of the coil 54 is connected to the positive electrode terminal 40p on the output side 36. A capacitor 56 is connected between the positive electrode terminal 40p and the negative electrode terminal 40m on the output side 36. Each of the switching elements 42H and 42L is formed by connecting in parallel a MOSFET (Metal Oxide Semiconductor Field Effect Transistor) 58 and a Zener diode 60 that is a parasitic diode.

In FIG. 2B, the capacitor 52 is connected between the positive electrode terminal 38p and the negative electrode terminal 38m on the input side 34. Two switching elements 42H and 42L connected in series are connected in parallel to the capacitor 52. The switching element 42H is a high-side switching element connected to the positive electrode terminal 38p of the capacitor 52. The switching element 42L is a low-side switching element connected to the negative electrode terminal 38m of the capacitor 52 and the negative electrode terminal 40m on the output side 36. A series circuit of the coil 54 and a resistor 62 is connected between the midpoint of the two switching elements 42H and 42L and the positive electrode terminal 40p on the output side 36. Further, the capacitor 56 is connected between the positive electrode terminal 40p and the negative electrode terminal 40m on the output side 36.

In FIG. 2C, the capacitor 52 is connected between the positive electrode terminal 38p and the negative electrode terminal 38m on the input side 34. The positive electrode terminal 38p of the capacitor 52 is connected, via a series circuit of a coil 64 and a resistor 66, to the midpoint between the two switching elements 42H and 42L connected in series. A capacitor 68 is connected in parallel to the two switching elements 42H and 42L. Further, a circuit having the same configuration as that in FIG. 2B is connected in parallel to the output side 36 of the capacitor 68.

In each circuit configuration, by changing the duty of the gate signal supplied to the gate terminal of each switching element 42H, 42L (MOSFET 58), it is possible to change the voltage conversion ratio Tr (the step-up ratio Tru or the step-down ratio R in FIG. 2A, the step-down ratio R in FIG. 2B, and the step-up ratio Tru or the step-down ratio R in FIG. 2C).

FIG. 3 shows, as an example, a timing chart of gate signals supplied to the gate terminals of the switching elements 42H and 42L in the step-down circuit of FIG. 2B. Here, when the period of the gate signal is represented by T, a high-level time of the gate signal supplied to the high-side switching element 42H ("Hi-side duty" in FIG. 3) is represented by U, a high-level time of the gate signal supplied to the low-side switching element 42L ("Lo-side duty" in FIG. 3) is represented by D, and a dead time, which is a time interval between the time U and the time D, is represented by Td, the period T is expressed by the following expression (1).

$$T = U + D + Td \times 2 \tag{1}$$

Further, when the voltage on the input side 34 (each of the battery voltages V1 to V4) is represented by Vin, and the voltage on the output side 36 (output voltage V0) is represented by Vout, the step-down ratio R is expressed by the following expression (2).

$$R = Vout/Vin \tag{2}$$

Further, the times U and D are expressed by the following expressions (3) and (4), respectively.

$$U = T \times R \quad (3)$$

$$D = T \times (1-R) \quad (4)$$

Therefore, by specifying the step-down ratio R by the control unit 46, and supplying the gate signal corresponding to the step-down ratio R to the equalization unit 14 from the command unit 48 to drive the first to fourth voltage converters 24a to 24d, a desired output voltage V0 can be obtained.

3. Characteristic Functions of Present Embodiment

3.1 Overview of Charging and Discharging Method According to Present Embodiment Next, characteristic functions of the power supply system 10 and the control method thereof according to the present embodiment (hereinafter also referred to as characteristic functions of the present embodiment) will be described with reference to FIGS. 4 to 17. The characteristic functions of the present embodiment are as follows: when the first to fourth batteries 12a to 12d having different voltages or SOCs are connected in parallel to each other and charging and discharging are performed by causing the first to fourth currents I1 to I4 to flow among the first to fourth batteries 12a to 12d so that the voltages or the SOCs are equal to each other, the first to fourth currents I1 to I4 flowing from the first to fourth batteries 12a to 12d to the input sides 34 are fed back to the control device 16, the control unit 46 of the control device 16 determines the current difference between the current flowing from the battery to be charged (reference power storage unit) and the current flowing from the battery to be discharged (remaining power storage unit), then determines the step-down ratio R such that the determined current difference becomes small, and controls the first to fourth voltage converters 24a to 24d with the determined step-down ratio R. As a result, the voltages or SOCs of the batteries 12a to 12d are equalized while avoiding deterioration of the batteries 12a to 12d.

Figure 4:
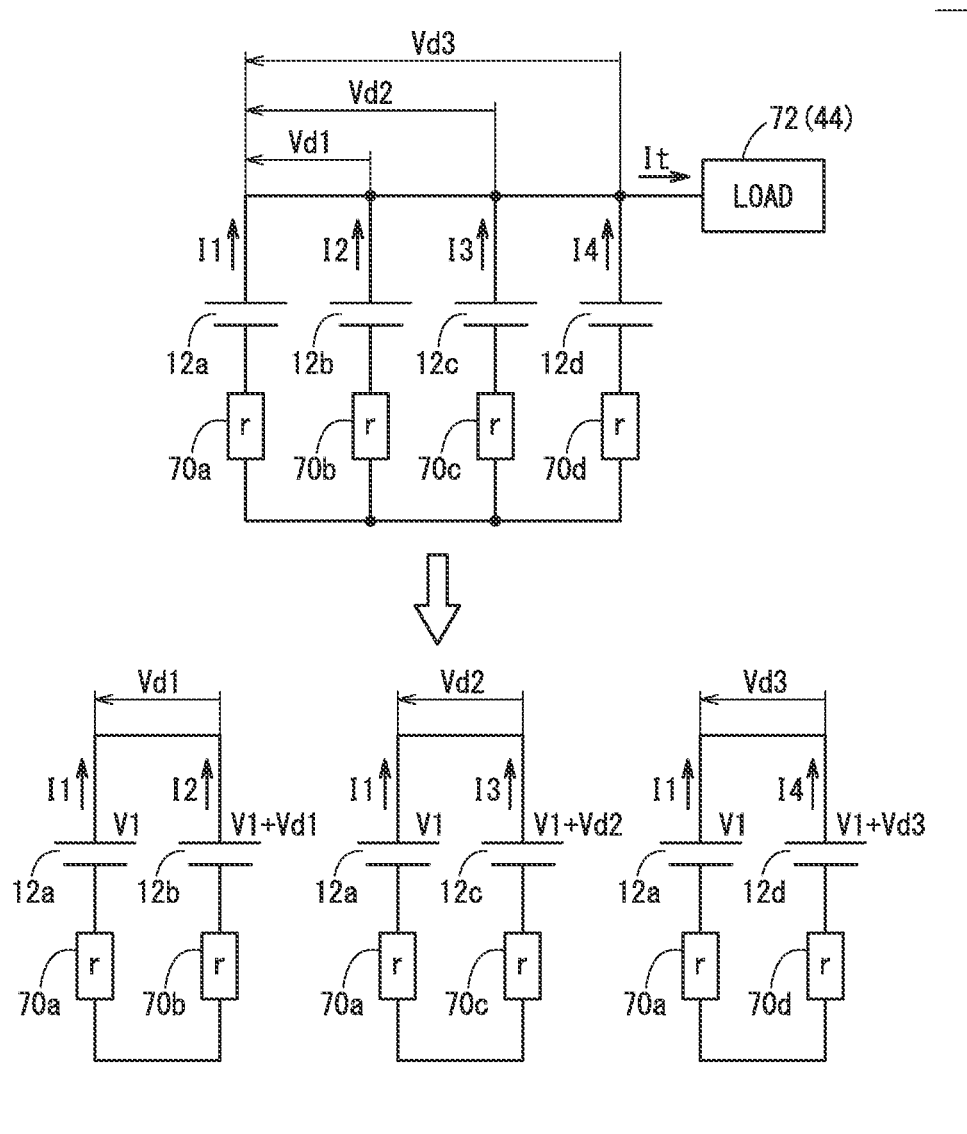
FIG. 4 is a circuit diagram schematically illustrating the power supply system of FIG. 1.
Figure 5:
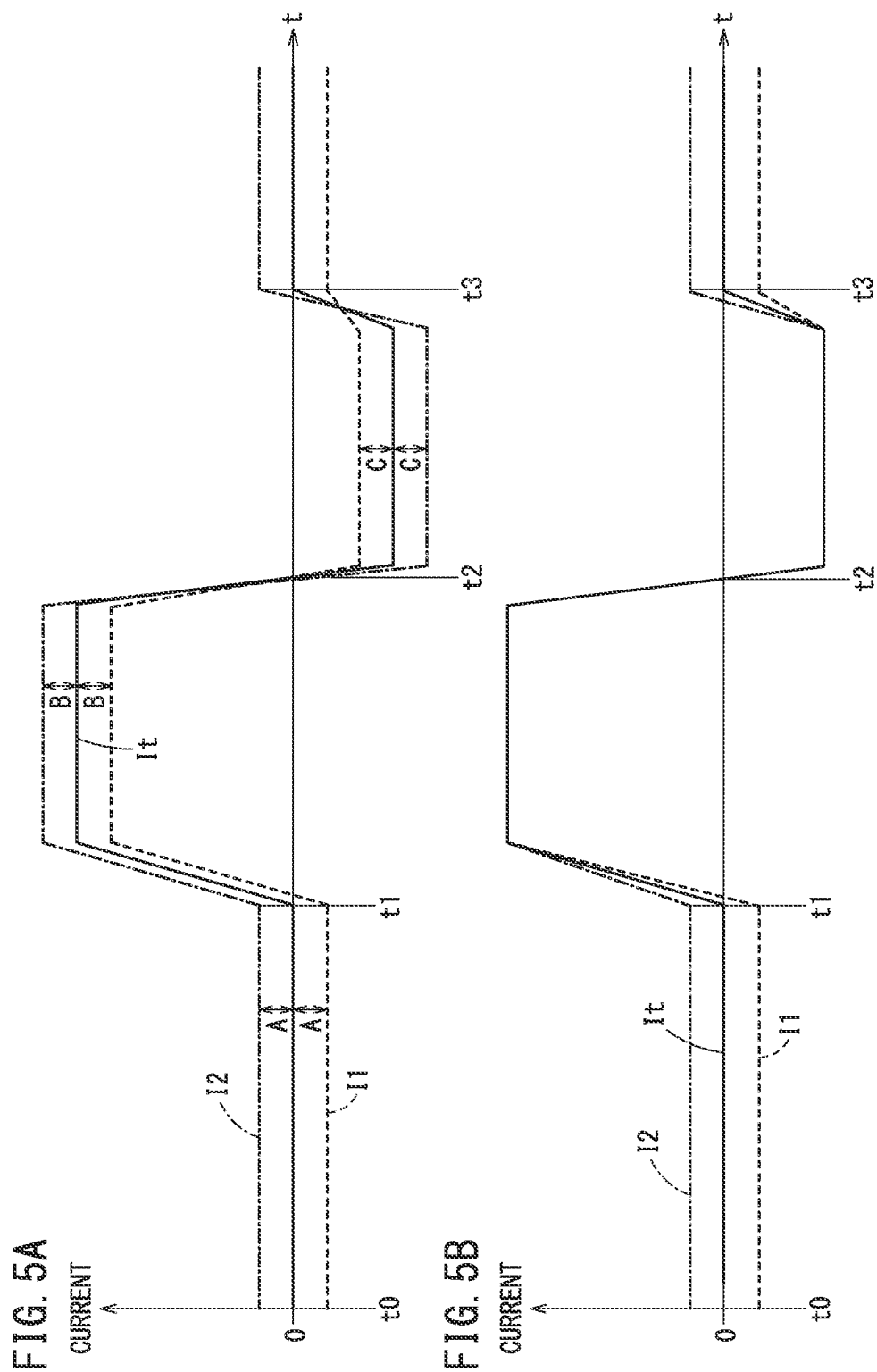
FIG. 5A is a timing chart of each current when a control method of the present embodiment is not used.
FIG. 5B is a timing chart of each current when the control method of the present embodiment is used.

FIG. 4 is a schematic circuit diagram of the power supply system 10 shown in FIG. 1. In the circuit diagram of FIG. 4, the equalization unit 14 and the like are not shown. Series circuits of the first to fourth batteries 12a to 12d and resistors 70a to 70d (hereinafter, also referred to as the first to fourth resistors 70a to 70d) indicating internal resistances (resistance values r) of the first to fourth batteries 12a to 12d are connected in parallel. A load 72 (motor 44) is connected to the positive electrodes of the first to fourth batteries 12a to 12d.

Here, the current flowing through the load 72 is represented by It (hereinafter also referred to as load current). Further, a voltage difference between the positive electrode side of the series circuit of the first battery 12a and the first resister 70a, and the positive electrode side of the series circuit of the second battery 12b and the second resister 70b is represented by Vd1. A voltage difference between the positive electrode side of the series circuit of the first battery 12a and the first resister 70a, and the positive electrode side of the series circuit of the third battery 12c and the third resister 70c is represented by Vd2. A voltage difference between the positive electrode side of the series circuit of the first battery 12a and the first resister 70a, and the positive electrode side of the series circuit of the fourth battery 12d and the fourth resister 70d is represented by Vd3.

First, as shown in the circuit diagram on the lower left side of FIG. 4, in a closed circuit configured by connecting in parallel the series circuit of the first battery 12a and the first resister 70a and the series circuit of the second battery 12b and the second resister 70b, the first current I1 and the second current I2 are expressed by the following expressions (5) and (6) based on Kirchhoff's law.

$$I1 = It/2 + Vd1/(4 \times r) \quad (5)$$

$$I2 = It/2 - Vd1/(4 \times r) \quad (6)$$

Further, in a closed circuit configured by connecting in parallel the series circuit of the first battery 12a and the first resister 70a, the series circuit of the second battery 12b and the second resister 70b, and the series circuit of the third battery 12c and the third resister 70c, the first to third currents I1 to I3 are expressed by the following expressions (7) to (9) based on Kirchhoff's law.

$$I1 = It/3 + (Vd1 + Vd2)/(6 \times r) \quad (7)$$

$$I2 = It/3 + (-2 \times Vd1 + Vd2)/(6 \times r) \quad (8)$$

$$I3 = It/3 + (Vd1 - 2 \times Vd2)/(6 \times r) \quad (9)$$

Further, in the upper circuit diagram in FIG. 4, in the case of a closed circuit to which the load 72 is not connected, the first to fourth currents I1 to I4 are expressed by the following expressions (10) to (13) based on Kirchhoff's law.

$$I1 = It/4 + (Vd1 + Vd2 + Vd3)/(8 \times r) \quad (10)$$

$$I2 = It/4 + (-3 \times Vd1 + Vd2 + Vd3)/(8 \times r) \quad (11)$$

$$I3 = It/4 + (Vd1 - 3 \times Vd2 + Vd3)/(8 \times r) \quad (12)$$

$$I4 = It/4 + (Vd1 + Vd2 - 3 \times Vd3)/(8 \times r) \quad (13)$$

As described above, the first to fourth currents I1 to I4 include the voltage differences Vd1 to Vd3. Therefore, theoretically, if the first to fourth currents I1 to I4 are measured by the first to fourth current measuring instruments 26a to 26d and the measured first to fourth currents I1 to I4 are fed back to the control device 16, it is possible to adjust the voltage differences Vd1 to Vd3 to desired voltage differences based on the first to fourth currents I1 to I4.

FIGS. 5A and 5B are timing charts showing examples of temporal changes of the first current I1, the second current I2, and the load current It. FIG. 5A shows a case where feedback of the first current I1 and the second current I2 is not performed. FIG. 5B shows a case where feedback of the first current I1 and the second current I2 is performed.

In FIG. 5A, the load 72 (see FIG. 4) is not present in the time period from a time point t0 to a time point t1, and It=0. In this case, a current difference of 2×A is generated between the first current I1 and the second current I2 due to the voltage difference Vd1. In this time period, the first current I1 is a negative current, that is, a charging current. On the other hand, the second current I2 is a positive current, that is, a discharge current. That is, since the load 72 is not present, the second current I2 flowing from the second battery 12b flows into the first battery 12a as the first current I1. Thus, the first battery 12a is charged.

Further, in FIG. 5A, the time period from the time point t1 to a time point t2 is the power running period in which the load 72 is present. A current difference of 2×B is generated between the first current I1 and the second current I2 due to the voltage difference Vd1. In this time period, both the first current I1 and the second current I2 are discharge currents. That is, the first current I1 and the second current I2 flowing from the first battery 12a and the second battery 12b flow to the load 72 as the load current It.

Further, in FIG. 5A, the time period from the time point t2 to a time point t3 is the regenerative period in which the load 72 is present, and the first battery 12a and the second battery 12b are charged from the load 72. In this case, a current difference of 2×C is generated between the first current I1 and the second current I2 due to the voltage difference Vd1. In this time period, both the first current I1 and the second current I2 are charging currents. That is, the load current It is divided into the first current I1 and the second current I2. The divided first current I1 flows into the first battery 12a, and the divided second current I2 flows into the second battery 12b.

Furthermore, in FIG. 5A, in the time period after the time point t3, It=0 similarly to the time period from t0 to t1. A current difference of 2×A is generated between the first current I1 and the second current I2 due to the voltage difference Vd1.

However, in the example of FIG. 5A, A≠B≠C, and the first current I1 and the second current I2 are not fed back to the control device 16 (see FIG. 1). Therefore, how the current difference changes due to the operation of the first to fourth voltage converters 24a to 24d is not known. As a result, there is a case where the first current I1 or the second current I2 becomes a large current, which may cause deterioration of the first battery 12a or the second battery 12b.

On the other hand, in the case of FIG. 5B, the first current I1 and the second current I2 are fed back to the control device 16, and the voltage difference Vd1 is controlled so that the current difference between the first current I1 and the second current I2 that have been fed back becomes small. Thus, in the time period from t1 to t3 in which the load 72 is present, the current difference changes so as to gradually decrease to 0. That is, the first current I1 and the second current I2 change so as to have the same current value as the load current It. As a result, it is possible to avoid deterioration of the first battery 12a or the second battery 12b due to the first current I1 or the second current I2 becoming a large current. Note that a certain current difference occurs in the time period from t0 to t1 and the time period after t3 in which the load 72 is not present.

FIG. 6 is an explanatory diagram illustrating a method of charging and discharging the first to fourth batteries 12a to 12d (see FIGS. 1 and 4) in the present embodiment. Here, the number of batteries 12a to 12d constituting the power supply system 10 is denoted by N, and a method of charging and discharging in the case of N=4 (first to fourth batteries 12a to 12d), N=3 (first to third batteries 12a to 12c), and N=2 (first and second batteries 12a and 12b) will be described.

In FIG. 6, MPP1 to MPP4 indicate the first to fourth batteries 12a to 12d. Further, in FIG. 6, a symbol such as "3H1L" indicates the number (the number indicated before "H") of batteries (remaining power storage units) to be discharged, and the number (the number indicated before "L") of batteries (reference power storage units) to be charged. Further, in FIG. 6, target values (target currents Itar) of the first to fourth currents I1 to I4 are indicated below the graphic symbols (figures of batteries) indicating the first to fourth batteries 12a to 12d. Here, the target current Itar of the battery to be discharged is indicated by a symbol such as "Id".

The target current Itar indicates a target value of the current flowing from the battery to be discharged. The target current of the battery to be discharged is set to 0 [A]. Therefore, the actual current value (actual current) flowing from each of the first to fourth batteries 12a to 12d may be different from the target current. For example, when charging and discharging are performed in the state of "1H3L", the target currents of the first to fourth currents I1 to I4 are set to 3.0×Id [A], 0.0 [A], 0.0 [A], and 0.0 [A]. On the other hand, actual currents of the first to fourth currents I1 to I4 are +2.25×Id [A], −0.75×Id [A], −0.75×Id [A], and −0.75×Id [A]. The positive and negative signs given to the first to fourth currents I1 to I4 are such that the direction in which the current flows from the first to fourth batteries 12a to 12d to the first to fourth voltage converters 24a to 24d is a positive (+) direction, and the direction in which the current flows from the first to fourth voltage converters 24a to 24d to the first to fourth batteries 12a to 12d is a negative (−) direction.

The target current Itar is set in advance in the table 50 (see FIG. 1). The control unit 46 changes each target current Itar in accordance with the number of batteries to be charged (reference power storage units), the number of batteries to be discharged (remaining power storage units), the sum of currents flowing from the plurality of batteries 12a to 12d, and the like described later. In this case, the number of batteries to be charged and the number of batteries to be discharged are sequentially changed from the upper side to the lower side of the list of FIG. 6. More specifically, the first to fourth batteries 12a to 12d are charged and discharged by sequentially reducing the number of batteries to be discharged.

Specifically, when N=4, charging and discharging are performed by switching the number of batteries to be charged and the number of batteries to be discharged in the order of "3H1L"->"2H2L"->"1H3L"->"0H4L". When N=3, charging and discharging are performed by switching the number of batteries to be charged and the number of batteries to be discharged in the order of "2H1L"->"1H2L"->"0H3L". When N=2, charging and discharging are performed by switching the number of batteries to be charged and the number of batteries to be discharged in the order of "1H1L"->"0H2L".

In the charging and discharging of the present embodiment, a relatively high step-down ratio (for example, R=0.94) is set to the voltage converter connected to the battery to be charged. In this state, a current is caused to flow from the battery to be discharged to the battery to be charged while maintaining a voltage difference between the battery to be charged and the battery to be discharged. Thus, the battery to be charged is charged. In this case, the step-down ratio R of the voltage converter connected to the battery to be discharged is set to be relatively lower than the step-down ratio R of the voltage converter connected to the battery to be charged.

However, when a current flows from the battery to be discharged to the battery to be charged, the battery voltage of the battery to be discharged decreases. The step-down ratio R of the voltage converter connected to the battery to be discharged gradually increases with time. Therefore, when the step-down ratio R of the voltage converter connected to the battery to be discharged reaches a maximum step-down ratio (for example, R=0.96 as an upper limit value), it becomes difficult to control this voltage converter. The maximum step-down ratio is a maximum step-down ratio that can be set in consideration of the dead time Td.

Therefore, in the present embodiment, as shown in FIG. 6, before the step-down ratio R of the voltage converter connected to the battery to be discharged reaches the maximum step-down ratio, switching from the upper side to the lower side in FIG. 6 is sequentially performed. Accordingly, charging and discharging of the first to fourth batteries 12a to 12d are smoothly performed while avoiding difficulty in controlling the first to fourth voltage converters 24a to 24d. A specific method of controlling charge and discharge will be described later.

3.2 Specific Control Method of Present Embodiment

Figure 7:
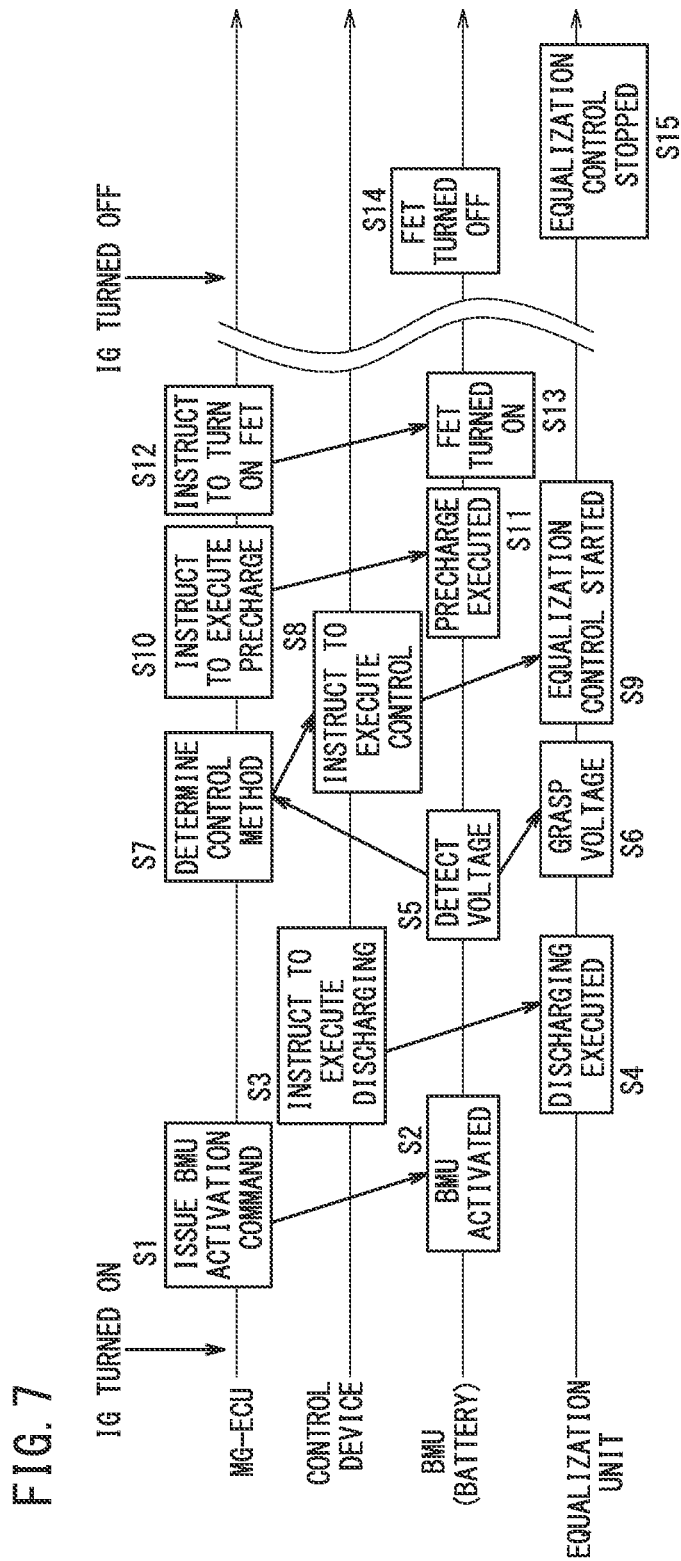
FIG. 7 is a sequence diagram of the control method according to the present embodiment.
Figure 9A:
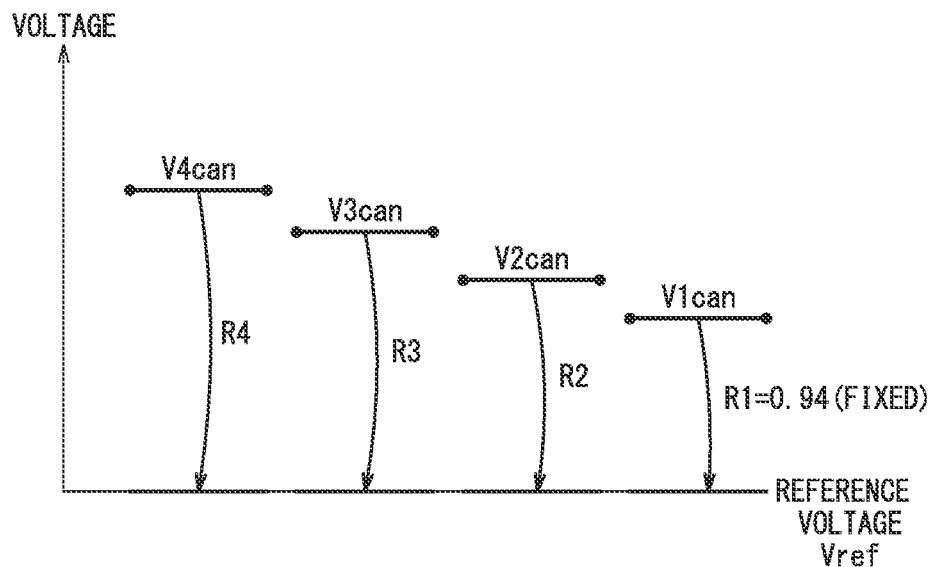
FIG. 9A is an explanatory diagram of a process of adjusting each battery voltage to a reference voltage.
Figure 9B:
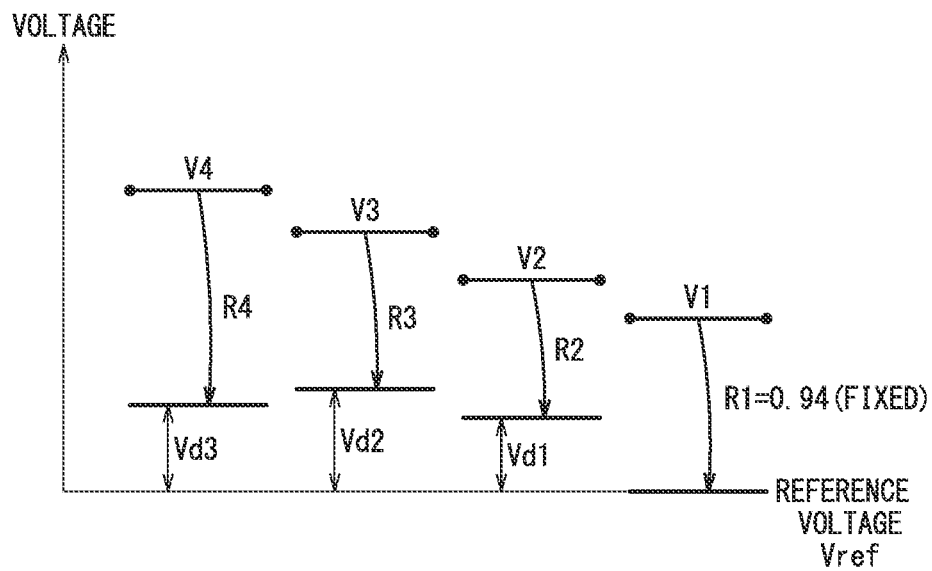
FIG. 9B is an explanatory diagram of an actual control process.

FIG. 7 is a sequence diagram of charge/discharge control for the first to fourth batteries 12a to 12d when the power supply system 10 according to the present embodiment is applied to the electric vehicle 22, to be more specific, when the motor 44 is used as a drive source for wheels of the electric vehicle 22. FIG. 8 is a flowchart showing operations of the equalization unit 14 and the control device 16 in the charge/discharge control of FIG. 7. In this description, charge/discharge control will be described in a case where the battery voltage V1 of the first battery 12a is the lowest and the battery voltages V1 to V4 of the first to fourth batteries 12a to 12d become higher in this order as illustrated in FIGS. 9A and 9B.

First, the overall flow of charge/discharge control will be described with reference to FIG. 7. When an ignition switch (IG) (not shown) of the electric vehicle 22 is turned on, the MG-ECU 18 issues an activation command for each BMU in step S1. As a result, in step S2, each BMU is activated based on the activation command from the MG-ECU 18.

In steps S1 and S2, the MG-ECU 18 also performs a numbering process on each BMU. In the numbering process, four batteries 12a to 12d are set as the first to fourth batteries 12a to 12d. Accordingly, each of the four batteries 12a to 12d is allocated to any of the first to fourth batteries 12a to 12d. The MG-ECU 18 notifies the control unit 46 of the control device 16 of the result of the numbering process.

Figure 10:
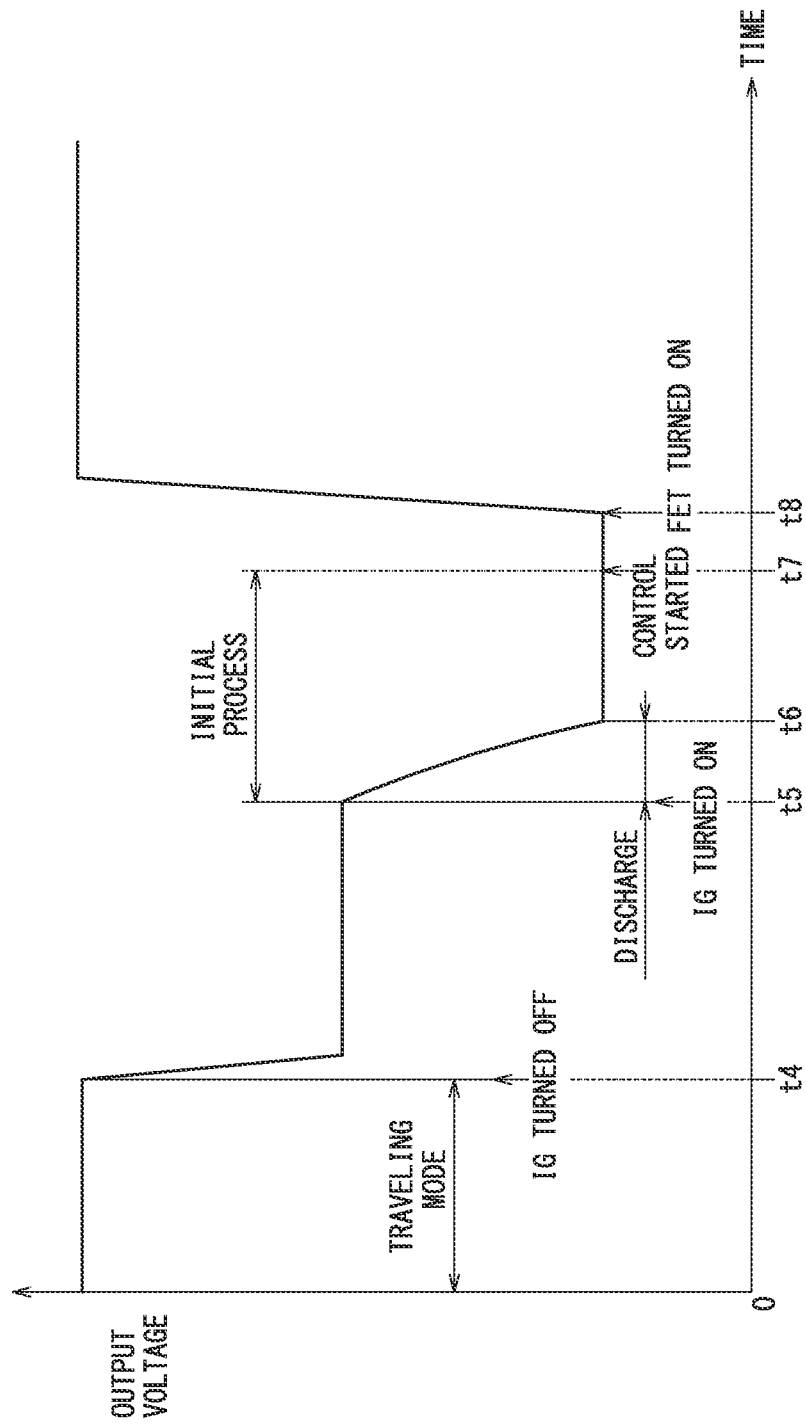
FIG. 10 is a timing chart illustrating a discharging process.

The capacitors 52, 56, and 68 are present in the first to fourth voltage converters 24a to 24d (see FIGS. 2A to 2C). Therefore, as shown in FIG. 10, even if the electric vehicle 22 stops and the ignition switch is turned off at a time point t4, a constant voltage is generated by the charges accumulated in the capacitors 52, 56, and 68, more specifically, by the charges stored between the equalization unit 14 and the PDU 20. Therefore, for example, in the time period from a time point t5 when the ignition switch is turned on to a time point t6, the control unit 46 of the control device 16 instructs the command unit 48 to execute a discharging process in step S3. In the discharging process, the switching elements 42H and 42L are driven to discharge the charges of the capacitors 52, 56, and 68. Accordingly, in step S4, the command unit 48 supplies a gate signal to the equalization unit 14 based on an instruction from the control unit 46. Accordingly, the switching elements 42H and 42L are turned on. As a result, the charges of the capacitors 52, 56, and 68 are discharged in the time period from the time point t5 to the time point t6, and the output voltage V0 can be decreased to near 0 [V].

In FIG. 7, the discharging process of steps S3 and S4 is executed after step S2. In the present embodiment, the discharging process may be executed after the ignition switch is turned on (time point t5 in FIG. 10) and before a process of step S9 described later is performed (time point t7).

In step S5, voltage sensors (not shown) in the battery packs detect the voltages (battery voltages V1 to V4) of the first to fourth batteries 12a to 12d. Accordingly, in step S6, the equalization unit 14 can grasp the battery voltages V1 to V4. In FIG. 9A, the battery voltages detected by the voltage sensors are shown as V1can to V4can. Further, the detection results from the voltage sensors are transmitted from the respective battery packs to the control device 16. The control device 16 transfers the detection results to the MG-ECU 18.

In step S7, the MG-ECU 18 determines the charge/discharge control to be performed on the first to fourth batteries 12a to 12d based on the result of the numbering process and the detection results of the battery voltages V1 to V4. In this case, the MG-ECU 18 determines that N=4 based on the result of the numbering process, and determines execution of charge/discharge control with N=4 in FIG. 6. In addition, the MG-ECU 18 determines that the first battery 12a having the lowest battery voltage among the battery voltages V1 to V4 of the first to fourth batteries 12a to 12d is the battery to be charged (reference power storage unit), and the remaining second to fourth batteries 12b to 12d are batteries to be discharged (remaining power storage units). Then, the MG-ECU 18 instructs the control device 16 to start charge/discharge control for the first to fourth batteries 12a to 12d.

In step S8, the control unit 46 of the control device 16 executes a control process for charge/discharge control based on the instruction from the MG-ECU 18, and instructs the command unit 48 to output gate signals. Accordingly, the command unit 48 starts supply of the gate signals to the equalization unit 14 based on the instruction from the control unit 46. As a result, in step S9, the switching elements 42H and 42L are driven in the equalization unit 14 based on the supplied gate signals. Thus, the charge/discharge control (equalization control) is started from the time point t7. That is, in the time period from t5 to t7 in FIG. 10, the processes from step S1 to step S8 in FIG. 7 as the initial process for the charge/discharge control are executed.

In step S10, the MG-ECU 18 instructs each battery pack to execute a precharge process for charging a capacitor (not shown) in the battery pack. Thus, in step S11, the capacitor is charged in each battery pack based on the instruction from the MG-ECU 18. In steps S10 and S11, the capacitors 52, 56, and 68 of the voltage converters 24a to 24d may also be charged. Further, in the present embodiment, the processes of steps S10 and S11 may be included in the initial process.

In step S12, the MG-ECU 18 instructs each battery pack to turn on a switching element (not shown) in the battery pack. As a result, in step S13, each battery pack turns on the switching element at a time point t8 in FIG. 10 based on the instruction from the MG-ECU 18. Thus, the first to fourth batteries 12a to 12d are electrically connected to the first to fourth voltage converters 24a to 24d. As a result, after the time point t8, it is possible to cause the current to flow from the first to fourth batteries 12a to 12d to the first to fourth voltage converters 24a to 24d, and charging and discharging of the first to fourth batteries 12a to 12d are performed.

Thereafter, when the ignition switch of the electric vehicle 22 is turned off, the switching element of each battery pack is turned off in step S14. As a result, in step S15, the charge/discharge control (equalization control) is also stopped. In FIG. 7, the processes of steps S1, S7, S11, and S13 may be performed by the control device 16.

FIG. 8 is a flowchart showing a specific method of the equalization control in FIG. 7. That is, the flowchart of FIG. 8 illustrates the flow of operations of the control device 16 and the equalization unit 14 in the time period from step S9 to step S15.

First, in step S21, the MG-ECU 18 or the control unit 46 determines a battery having the lowest battery voltage among the first to fourth batteries 12a to 12d, as a battery to be charged (reference power storage unit). As illustrated in FIG. 9A, the battery voltage V1 (V1can) of the first battery 12a is the lowest. Therefore, the control unit 46 determines the first battery 12a as the battery to be charged. From step S9 to step S12 in FIG. 7, the switching element of each battery pack is off. Therefore, the first to fourth batteries 12a to 12d are not electrically connected to the first to fourth voltage converters 24a to 24d. In this case, the MG-ECU 18 or the control unit 46 may determine the first battery 12a as the battery to be charged based on the battery voltages V1 to V4 (V1can to V4can) of the first to fourth batteries 12a to 12d, as detected by voltage sensors (not shown) in the respective battery packs.

Next, the control unit 46 sets a reference voltage Vref that is based on the battery voltage V1 of the first battery 12a. Specifically, the reference voltage Vref is calculated by the following expression (14) using the battery voltage V1 of the first battery 12a and a step-down ratio R1 of the first voltage converter 24a connected to the first battery 12a.

$$Vref = R1 \times (\text{lowest battery voltage } (V1)) \quad (14)$$

As described above, in consideration of the dead time Td, the upper limit value of the step-down ratio R is 0.96. Therefore, the control unit 46 sets R1=0.94, for example. Next, the control unit 46 sets the values (initial values) of the battery voltages V1 to V4 of the first to fourth batteries 12a to 12d used in the charging and discharging process, to the reference voltage Vref, whereby the values of the battery voltages V1 to V4 are equalized. As a result, the voltage differences among the first to fourth batteries 12a to 12d temporarily become 0 [V].

Next, as a result of the processes of steps S10 to S13, the first to fourth batteries 12a to 12d are electrically connected to the first to fourth voltage converters 24a to 24d, whereby the first to fourth voltage measuring instruments 28a to 28d can measure the battery voltages V1 to V4 of the first to fourth batteries 12a to 12d, and the first to fourth current measuring instruments 26a to 26d can measure the first to fourth currents I1 to I4. Then, in step S22, the control unit 46 acquires the battery voltages V1 to V4 of the first to fourth batteries 12a to 12d from the first to fourth voltage measuring instruments 28a to 28d, and acquires the first to fourth currents I1 to I4 from the first to fourth current measuring instruments 26a to 26d.

Figure 11:
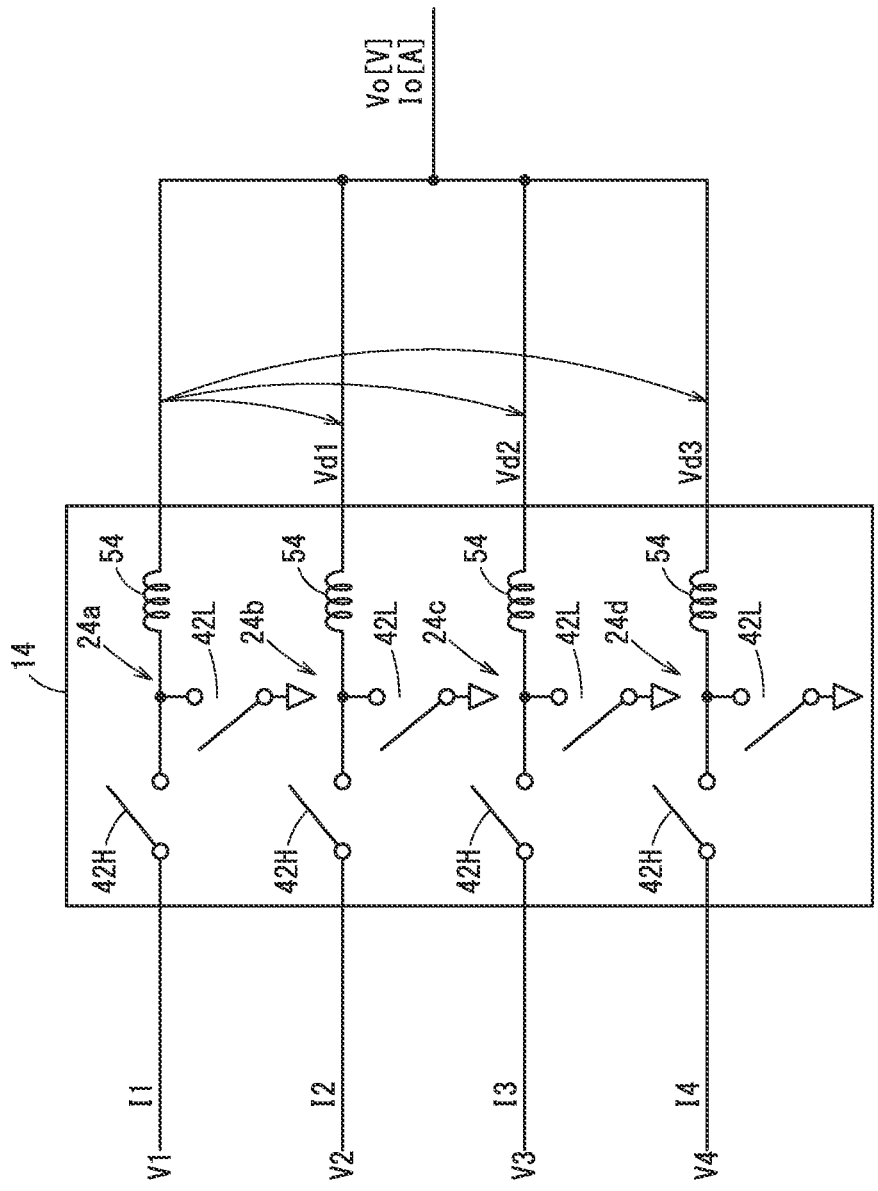
FIG. 11 is a block diagram schematically illustrating an equalization unit.
Figure 12:
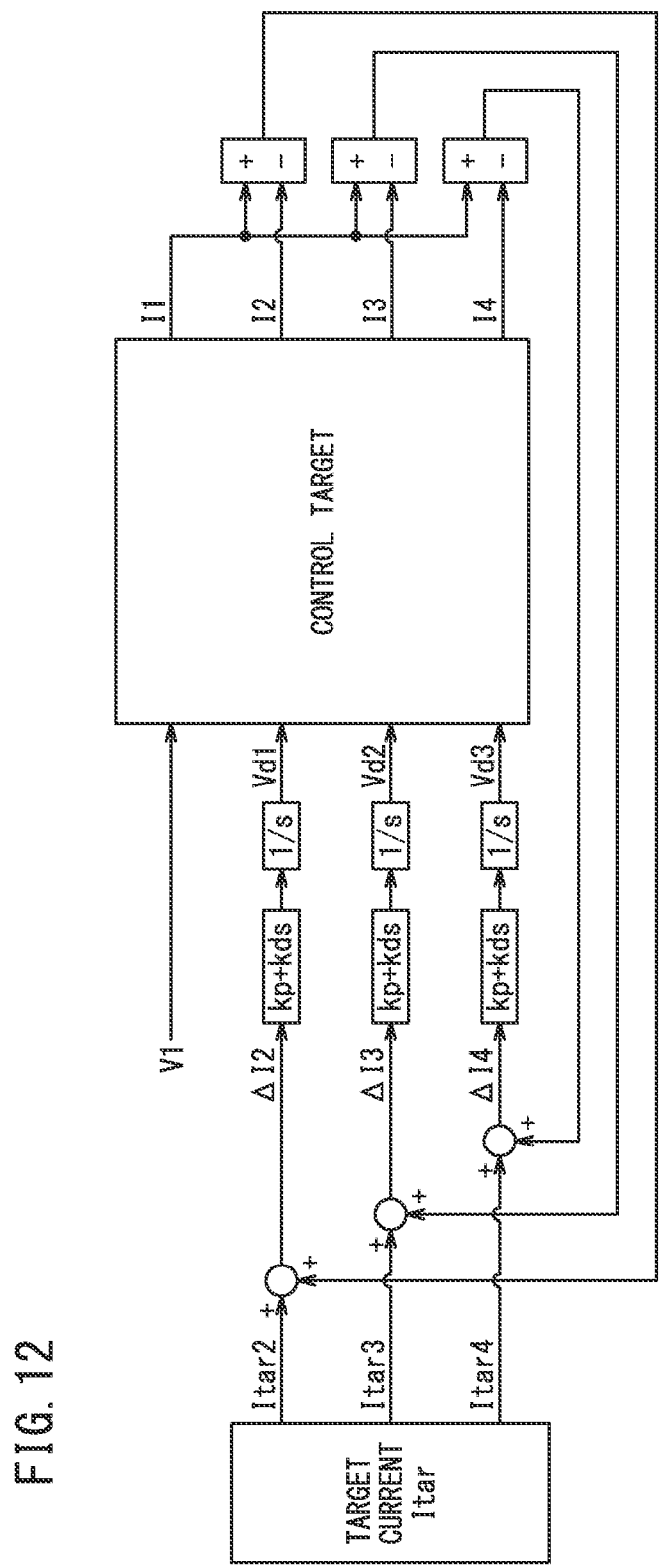
FIG. 12 is a block diagram illustrating the control method according to the present embodiment.

In next step S23, the control unit 46 calculates the current differences among the first to fourth currents I1 to I4 using the acquired first to fourth currents I1 to I4. FIG. 11 is a block diagram schematically illustrating the equalization unit 14. FIG. 12 is a block diagram illustrating the charge/discharge control in the control device 16 and the equalization unit 14. In FIG. 12, the "control target" is the power supply system 10 including the equalization unit 14. Further, in FIG. 12, "s" in the "kp+kds" block and the "1/s" block is a variable of a complex number in the Laplace transform.

In FIGS. 11 and 12, the control unit 46 sets the first battery 12a as the battery to be charged (reference power storage unit), and sets the second to fourth batteries 12b to 12d as the batteries to be discharged (remaining power storage units). Therefore, the control unit 46 subtracts each of the second to fourth currents I2 to I4 from the first current I1.

In next step S24, based on the acquired battery voltages V1 to V4, the control unit 46 determines to which state in FIG. 6 the charge/discharge state at the present time corresponds. In this case, the control unit 46 determines that the state is "3H1L" in FIG. 6.

Next, as in the following expressions (15) to (17), the control unit 46 adds target currents Itar2 to Itar4 to the current differences obtained by subtraction in step S23.

Thus, the current difference between the first current I1 and each of the second to fourth currents I2 to I4 is calculated. Current differences ΔI2 to ΔI4 in expressions (15) to (17) are target currents (target operation currents) for actually controlling the first to fourth voltage converters 24a to 24d. That is, the control unit 46 can set the target operation currents ΔI2 to ΔI4 by adding the target currents Itar2 to Itar4 to the respective current differences.

$$\Delta I2 = I1 - I2 + Itar2 \quad (15)$$

$$\Delta I3 = I1 - I3 + Itar3 \quad (16)$$

$$\Delta I4 = I1 - I4 + Itar4 \quad (17)$$

In next step S25, as in the following expressions (18) to (20), the control unit 46 uses the target operation currents (current differences) ΔI2 to ΔI4 calculated in step S24 to calculate voltage differences Vd1 to Vd3 between the battery voltage V1 of the first battery 12a and the battery voltages V2 to V4 of the second to fourth batteries 12b to 12d. In expressions (18) to (20), "∫" is an integral symbol. In addition, kp and kd are fixed coefficients in feedback control. ΔI2p to ΔI4p are previous target operation currents.

$$Vd1 = \int \{kp \times \Delta I2 + kd \times (\Delta I2 - \Delta I2p)\} \quad (18)$$

$$Vd2 = \int \{kp \times \Delta I3 + kd \times (\Delta I3 - \Delta I3p)\} \quad (19)$$

$$Vd3 = \int \{kp \times \Delta I4 + kd \times (\Delta I4 - \Delta I4p)\} \quad (20)$$

In next step S26, the control unit 46 calculates the step-down ratios R2 to R4 using the calculated voltage differences Vd1 to Vd3. In step S27, the command unit 48 outputs gate signals based on the step-down ratios R1 to R4, to the equalization unit 14. Thus, the switching elements 42H and 42L of the first to fourth voltage converters 24a to 24d are driven based on the supplied gate signals. As a result, in step S28, the current values of the first to fourth currents I1 to I4 are changed by the voltage differences Vd1 to Vd3 shown in FIG. 9B.

In next step S29, the control unit 46 determines whether to stop the equalization control. If step S15 has not been reached, the control unit 46 determines to continue the equalization control (step S29: NO), returns to step S22, and performs the processes of steps S22 to S29 again. Therefore, every time the processes of steps S22 to S29 are repeatedly executed, the states of the first to fourth batteries 12a to 12d are sequentially switched from "3H1L" to "2H2L", "1H3L", and "0H4L" in FIG. 6. Thereafter, when step S15 is reached, the control unit 46 stops the equalization control (step S29: YES).

Figure 13:
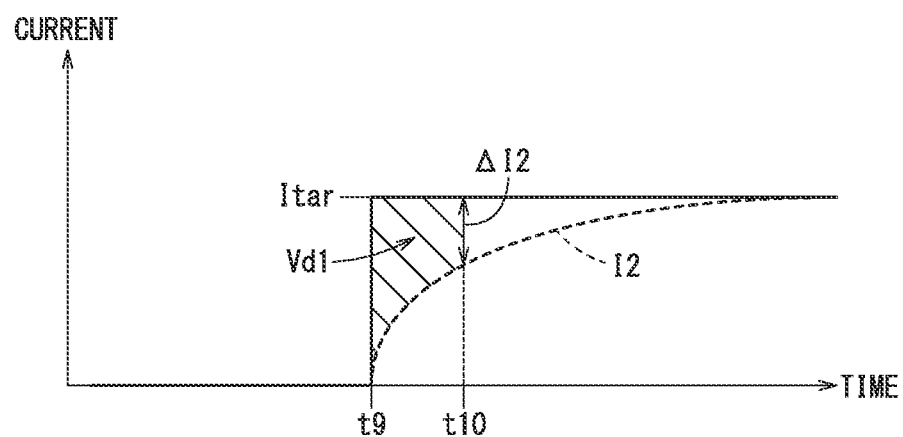
FIG. 13 is a timing chart illustrating the relationship between a target current and a second current.

FIG. 13 is a timing chart showing the effect of the control process of FIG. 8. At a time point t9, the target current Itar is set. Thus, the switching elements 42H and 42L are driven by the voltage difference Vd1 based on the target current Itar, whereby the second current I2 rapidly increases toward the target current Itar with the lapse of time after the time point t9. In this case, by appropriately setting the fixed coefficients kp and kd, the time required for the second current I2 to converge to the target current Itar can be shortened. In FIG. 13, the difference between the target current Itar and the second current I2 at an arbitrary time point t10 is the target operation current (current difference) ΔI2. Further, between the time point t9 and the time point t10, an area of a portion surrounded by the target current Itar and the second current I2 indicates the voltage difference Vd1.

3.3 Necessity of Step-Down Ratio R in Charge/Discharge Control

Figure 14:
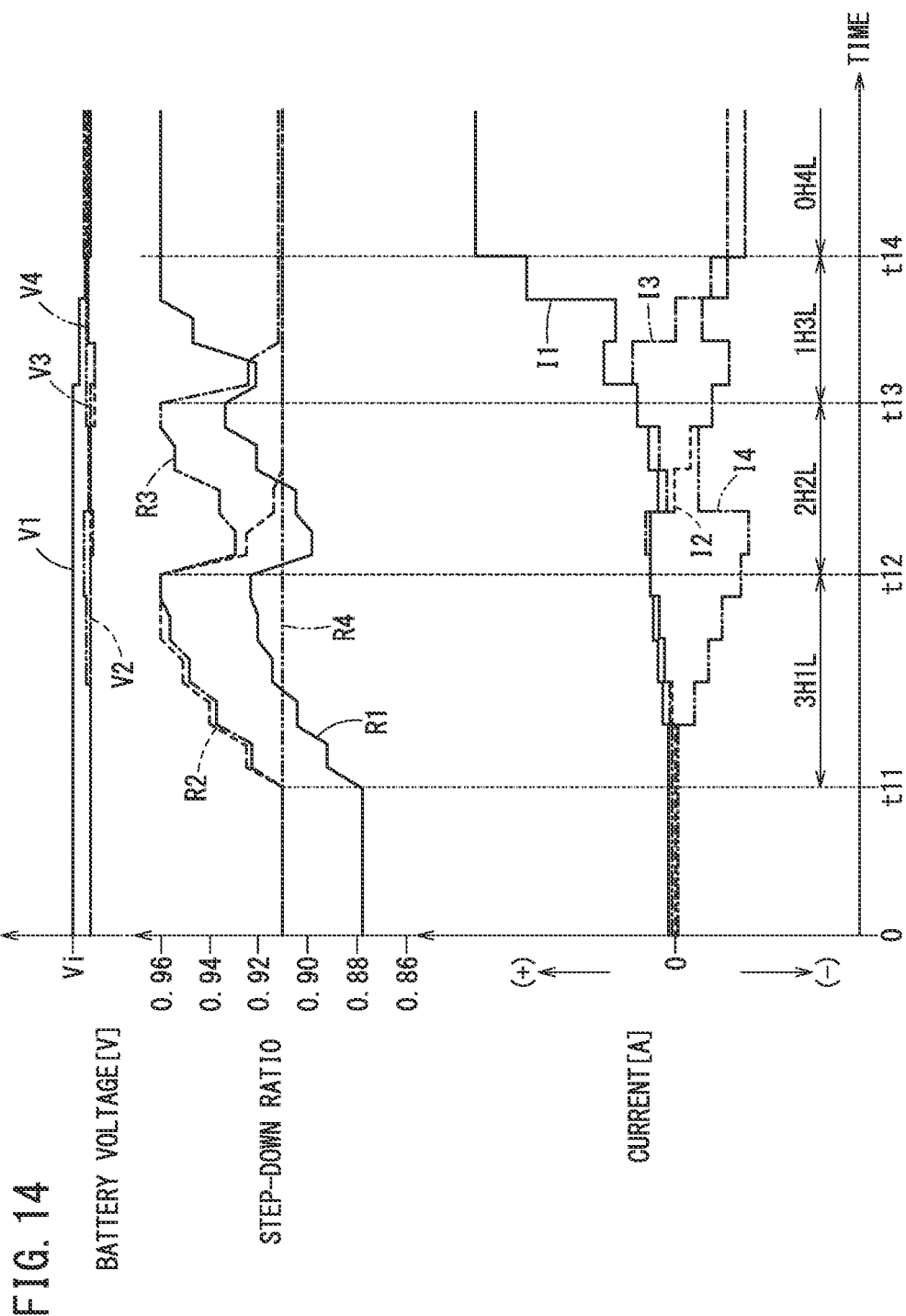
FIG. 14 is a timing chart showing temporal changes of each battery voltage, each current, and each step-down ratio.

Next, the necessity of taking into account the step-down ratio R in the present embodiment will be described with reference to FIGS. 14 to 16D. FIG. 14 is a timing chart showing temporal changes of the first to fourth currents I1 to I4, the battery voltages V1 to V4, and the step-down ratios R1 to R4 in the charge/discharge control according to the present embodiment. Here, as shown in FIG. 6, a case will be described where N=4 and the batteries to be discharged and the batteries to be charged are switched in the order of "3H1L"->"2H2L"->"1H3L"->"0H4L" at time points t11, t12, t13, and t14.

In this case, initially, the battery to be charged is the fourth battery 12d, and the step-down ratio R4 of the fourth voltage converter 24d connected to the fourth battery 12d is fixed to 0.91. Therefore, initially, the first to third batteries 12a to 12c serve as the batteries to be discharged.

First, in the time period from t11 to t12, the first to third currents I1 to I3 are discharge currents (positive currents), and the fourth current I4 is a charging current (negative current). As a result, the step-down ratios R1 to R3 of the first to third voltage converters 24a to 24c increase over time. Then, at the time point t12, when the step-down ratios R2 and R3 of the second and third voltage converters 24b and 24c reach near 0.96 (the upper limit value of the settable step-down ratio), "3H1L" is switched to "2H2L".

Accordingly, in the time period from t12 to t13, switching is performed such that the first and third batteries 12a and 12c are batteries to be discharged, and the second and fourth batteries 12b and 12d are batteries to be charged. That is, the first and third currents I1 and I3 are discharge currents, and the second and fourth currents I2 and I4 are charging currents. As a result, the step-down ratios R1 and R3 of the first and third voltage converters 24a and 24c increase over time. On the other hand, since the second battery 12b is switched to the battery to be charged, the step-down ratio R2 of the second voltage converter 24b decreases to the step-down ratio R4 (0.91) of the fourth voltage converter 24d. Then, when the step-down ratio R3 of the third voltage converter 24c reaches near 0.96 at the time point t13, "2H2L" is switched to "1H3L".

Accordingly, in the time period from t13 to t14, switching is performed such that the first battery 12a is the battery to be discharged, and the second to fourth batteries 12b to 12d are the batteries to be charged. That is, the first current I1 is the discharge current, and the second to fourth currents I2 to I4 are the charging currents. As a result, the step-down ratio R1 of the first voltage converter 24a increases over time. On the other hand, since the third battery 12c is switched to the battery to be charged, the step-down ratio R3 of the third voltage converter 24c decreases to the step-down ratios R2 and R4 (0.91) of the second and fourth voltage converters 24b and 24d. Then, at a time point t14, when the step-down ratio R1 of the first voltage converter 24a reaches near 0.96, "1H3L" is switched to "0H4L". As a result, the charge/discharge control is completed.

The reason why it is necessary to take into account the step-down ratio R (R1 to R4) for such charge/discharge control is as follows. As shown in FIG. 15, for example, the battery voltages V1 to V4 of the first to fourth batteries 12a to 12d in a fully charged state are defined as Vi [V]. A portion of each of the step-down ratios R1 to R4 corresponding to the dead time Td is set to 0.31. In addition, an adjustable range of the battery voltages V1 to V4 (a settable range of the step-down ratios R1 to R4) is set to 0.75×Vi [V] to 0.96×Vi [V] (R1 to R4=0.75 to 0.96), in consideration of the dead time Td. Further, the reference voltage Vref is set to 0.94×Vi [V] (R=0.94).

Figure 16A:
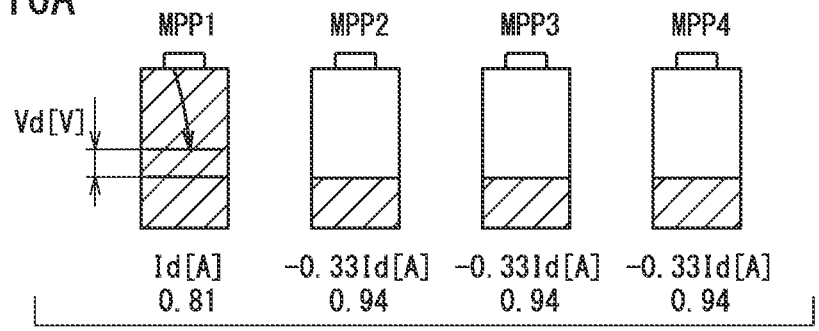
FIGS. 16A, 16B, 16C, and 16D are explanatory diagrams each showing a problem in a case where control using a current difference is not performed.

In the present embodiment, as shown in FIG. 16A, while maintaining the voltage difference between the battery to be discharged and the battery to be charged serving as a reference, the current is caused to flow from the battery to be discharged to the battery to be charged. As a result, the battery to be charged is charged. As an example, in FIG. 16A, in the state of "1H3L", the first battery 12a is set as the battery to be discharged, and the second to fourth batteries 12b to 12d are set as the batteries to be charged. Therefore, the initial step-down ratio R1 of the first voltage converter 24a is set to 0.81, and the step-down ratios R2 to R4 of the second to fourth voltage converters 24b to 24d are set (fixed) to 0.94. Further, the voltage difference between the first battery 12a and each of the second to fourth batteries 12b to 12d is set to Vd [V].

Figure 16B:
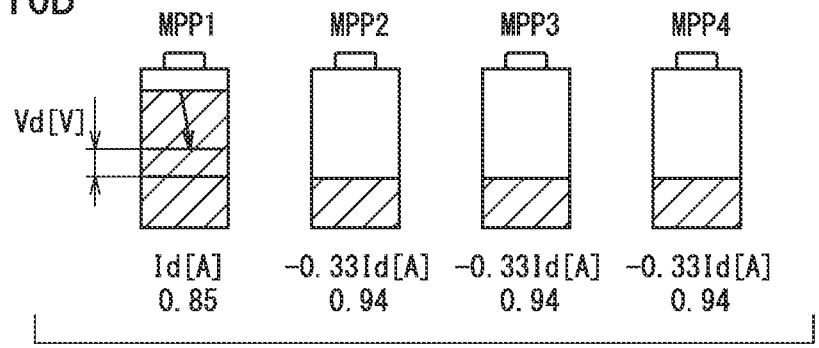
Figure 16C:
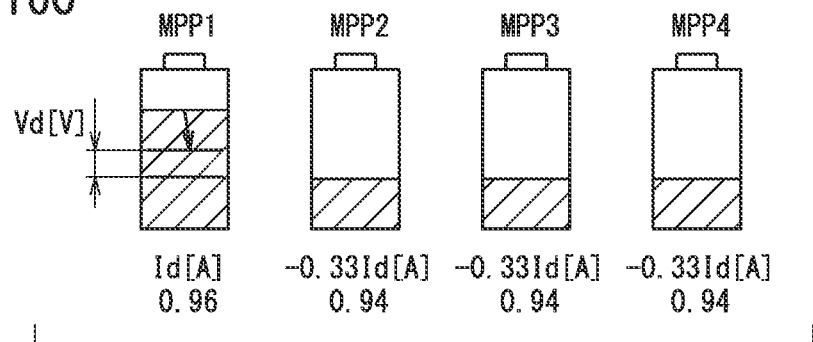
Figure 16D:
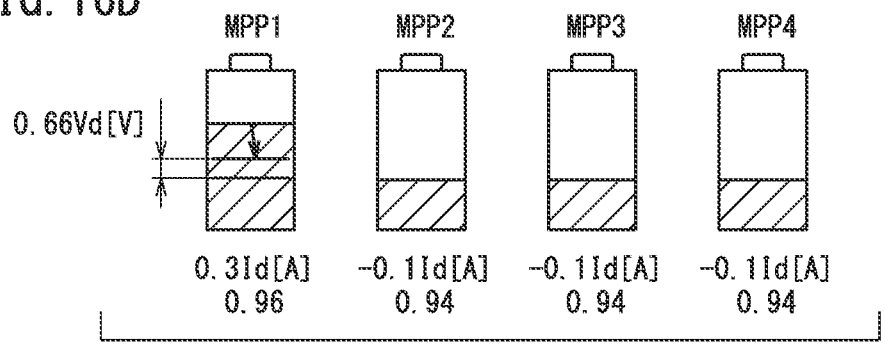

While maintaining this voltage difference, a current is caused to flow from the first battery 12a to be discharged to the second to fourth batteries 12b to 12d to be charged. As a result, as shown in FIG. 16B, the battery voltage V1 or the SOC of the first battery 12a decreases, and the step-down ratio R1 increases. Then, as shown in FIG. 16C, even when the step-down ratio R1 of the first voltage converter 24a reaches 0.96, if the voltage difference is to be maintained, the step-down ratio R1 does not increase from 0.96 and is saturated. This makes the charge/discharge control difficult. As a result, as shown in FIG. 16D, the voltage difference decreases, and the absolute values of the target currents of the first to fourth currents I1 to I4 decrease.

Therefore, in the present embodiment, as shown in FIG. 14, before the step-down ratio R of the voltage converter connected to the battery to be discharged reaches the upper limit value (R=0.96) set in consideration of the dead time Td, the combination of the number of the batteries to be discharged and the number of the batteries to be charged is changed. This avoids a situation in which the charge/discharge control becomes difficult.

3.4 Example of Application to Electric Vehicle 22

FIG. 17 is a timing chart showing temporal changes of the vehicle speed, the current, and the SOC when the power supply system 10 according to the present embodiment is mounted on the electric vehicle 22. In this case, the electric vehicle 22 activated in the time period before a time point t15 stops in the time period from the time point t15 to a time point t16, and thereafter, performs acceleration traveling from the time point t16. Thereafter, the electric vehicle 22 performs cruising from a time point t17, changes to deceleration traveling from a time point t18, and stops at a time point t19.

In this case, by performing the above-described charge/discharge control, charging and discharging are performed between the battery to be discharged and the battery to be charged during stopping of the electric vehicle 22 (the time period from t15 to t16, the time period after the time point t19) and during cruising (a part of the time period from t17 to t18). In FIG. 17, the current flowing from the battery to be discharged and the SOC thereof are indicated by broken lines. The current flowing into the battery to be charged and the SOC thereof are indicated by solid lines.

4. Effects of Present Embodiment

As described above, the present embodiment relates to the power supply system 10 and the control method thereof, the power supply system 10 including: a plurality of chargeable and dischargeable batteries 12a to 12d (power storage units); a plurality of voltage converters 24a to 24d having input sides 34 connected to the plurality of batteries 12a to 12d, respectively, and output sides 36 connected in parallel to each other, the voltage converters 24a to 24d being configured to convert the voltages V1 to V4 of the plurality of batteries 12a to 12d connected to the input sides 34 at arbitrary voltage conversion ratios Tr and output the converted voltages V0 to the output sides 36; and a plurality of current measuring instruments 26a to 26d connected to the input sides 34 of the plurality of voltage converters 24a to 24d, respectively, and configured to measure the currents I1 to I4 flowing from the plurality of batteries 12a to 12d to the input sides 34.

In this case, the power supply system 10 includes: a power storage unit determination unit (the MG-ECU 18, the control unit 46) configured to determine at least one of the plurality of batteries 12a to 12d as a battery to be charged (reference power storage unit) and determine the remaining batteries as batteries to be discharged (remaining power storage units); a current difference determination unit (the control unit 46) configured to determine a current difference between each of the currents flowing from the batteries to be discharged and the current flowing from the battery to be charged, based on the currents I1 to I4 measured by the plurality of current measuring instruments 26a to 26d; and a voltage conversion ratio determination unit (the control unit 46) configured to determine the voltage conversion ratio Tr of each of the voltage converters connected to the batteries to be discharged, based on the determined current difference.

Further, the method for controlling the power supply system 10 includes: the step (step S7) of using the MG-ECU 18 or the control unit 46 to determine at least one of the plurality of batteries 12a to 12d as a battery to be charged and determine the remaining batteries as batteries to be discharged; the step (steps S23 and S24) of using the control unit 46 to determine a current difference between each of the currents flowing from the batteries to be discharged and the current flowing from the battery to be charged, based on the currents I1 to I4 measured by the plurality of current measuring instruments 26a to 26d; and the step (step S26) of using the control unit 46 to determine the voltage conversion ratio Tr of each of the voltage converters connected to the batteries to be discharged, based on the determined current difference.

Thus, the current difference between each of the currents flowing from the batteries to be discharged and the current flowing from the battery to be charged is fed back, and the voltage conversion ratio Tr of each of the voltage converters connected to the batteries to be discharged is determined so that the current difference becomes small. As a result, in a case where the plurality of batteries 12a to 12d are connected in parallel to each other via the voltage converters 24a to 24d, it is possible to equalize the battery voltages V1 to V4 or the SOCs of the plurality of batteries 12a to 12d connected in parallel to each other while avoiding deterioration of the batteries 12a to 12d.

In this case, the MG-ECU 18 or the control unit 46 determines, as the battery to be charged, the battery having the lowest voltage among the plurality of batteries 12a to 12d, and determines the remaining batteries as the batteries to be discharged. This makes it possible to efficiently determine the batteries to be discharged and the battery to be charged.

The control unit 46 calculates the current difference by subtracting each of the currents flowing from the batteries to be discharged from the current flowing from the battery to be charged, and adding together the current obtained by the subtraction and the target current Itar. By such feedback control, it is possible to perform charge/discharge control while preventing the current flowing from each of the batteries 12a to 12d from becoming excessive.

Further, the current value of the target current Itar is set in accordance with the number of the plurality of batteries 12a to 12d, the number of the batteries to be charged, or the sum of the currents flowing from the plurality of batteries 12a to 12d. As a result, the target current can be appropriately set in accordance with the number of the batteries 12a to 12d.

Further, the control unit 46 calculates the voltage difference between the battery voltage of the battery to be charged and each of the battery voltages of the batteries to be discharged, based on the current difference, and determines the voltage conversion ratio Tr of each of the voltage converters connected to the batteries to be discharged by using the calculated voltage difference. In this way, the voltage conversion ratio Tr is determined using the voltage difference reflecting the current difference. Accordingly, it is possible to prevent the current flowing from each of the batteries 12a to 12d from becoming excessive, and to efficiently suppress the occurrence of deterioration of the batteries 12a to 12d.

A case where the voltage converters 24a to 24d are controlled using the step-down ratio R has been mainly described above. In the present embodiment, it is a matter of course that the voltage converters 24a to 24d can be suitably controlled also in a case where the step-up ratio Tru is used.

The present invention is not limited to the above-described embodiment, and it goes without saying that various configurations could be adopted therein based on the contents described in this specification.

What is claim is:

1. A power supply system comprising:
   a plurality of power storage units that are chargeable and dischargeable;
   a plurality of voltage converters each having an input side connected to any one of the plurality of power storage units, the voltage converters having output sides connected in parallel to each other, the voltage converters each being configured to convert a voltage of the power storage unit connected to the input side at an arbitrary voltage conversion ratio, and output the converted voltage to the output side; and
   a plurality of current measuring instruments connected to the input sides of the plurality of voltage converters, respectively, and configured to measure currents flowing between the plurality of power storage units and the plurality of voltage converters corresponding thereto,
   the power supply system further comprising:
   a power storage unit determination unit configured to determine at least one of the plurality of power storage units as a reference power storage unit and determine at least one of remaining ones of the plurality of power storage units as a remaining power storage unit;
   a current difference determination unit configured to determine a current difference between a first current flowing between the reference power storage unit and the voltage converter connected to the reference power storage unit, and a second current flowing between the remaining power storage unit and the voltage converter connected to the remaining power storage unit, based on the currents measured by the plurality of current measuring instruments; and a voltage conversion ratio determination unit configured to determine a voltage conversion ratio of the voltage converters connected to the remaining power storage unit, based on the determined current difference.

2. The power supply system according to claim 1, wherein the power storage unit determination unit determines, as the reference power storage unit, the power storage unit having a lowest voltage among the plurality of power storage units.

3. The power supply system according to claim 1, wherein the current difference determination unit calculates the current difference by subtracting the second current from the first current, and adding together the first current after being subjected to the subtraction and a target current.

4. The power supply system according to claim 3, wherein a current value of the target current is set in accordance with a number of the plurality of power storage units, a number of the reference power storage units, or a sum of the currents flowing between the plurality of power storage units and the plurality of voltage converters corrersponding thereto.

5. The power supply system according to claim 1, wherein the voltage conversion ratio determination unit calculates a voltage difference between a voltage of the reference power storage unit and a voltage of the remaining power storage unit based on the current difference, and determines the voltage conversion ratio of the voltage converter connected to the remaining power storage unit by using the calculated voltage difference.

6. A method for controlling a power supply system, the power supply system including:
a plurality of power storage units that are chargeable and dischargeable;
a plurality of voltage converters each having an input side connected to any one of the plurality of power storage units, the voltage converters having output sides connected in parallel to each other, the voltage converters each being configured to convert a voltage of the power storage unit connected to the input side at an arbitrary voltage conversion ratio, and output the converted voltage to the output side; and
a plurality of current measuring instruments connected to the input sides of the plurality of voltage converters, respectively, and configured to measure currents flowing between the plurality of power storage units and the plurality of voltage converters corresponding thereto,
the method comprising:
a step of determining, by a power storage unit determination unit, at least one of the plurality of power storage units as a reference power storage unit, and determining, by the power storage unit determination unit, at least one of remaining ones of the plurality of power storage units as a remaining power storage unit;
a step of determining, by a current difference determination unit, a current difference between a first current flowing between the reference power storage unit and the voltage converter connected to the reference power storage unit, and a second current flowing between the remaining power storage unit and the voltage converter connected to the remaining power storage unit, based on the currents measured by the plurality of current measuring instruments; and
a step of determining, by a voltage conversion ratio determination unit, a voltage conversion ratio of the voltage converter connected to the remaining power storage unit, based on the determined current difference.

* * * * *